United States Patent
Murota et al.

US 6,706,462 B2

(10) Patent No.: US 6,706,462 B2
(45) Date of Patent: Mar. 16, 2004

(54) PHOTOSENSITIVE IMAGE-RECORDING MATERIAL

(75) Inventors: Yasubumi Murota, Shizuoka (JP); Kazuto Kunita, Shizuoka (JP); Shigeo Koizumi, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 0 days.

(21) Appl. No.: 09/836,296

(22) Filed: Apr. 18, 2001

(65) Prior Publication Data

US 2002/0072011 A1 Jun. 13, 2002

(30) Foreign Application Priority Data

Apr. 18, 2000 (JP) .................................... P. 2000-116759
Apr. 18, 2000 (JP) .................................... P. 2000-116760

(51) Int. Cl.$^7$ .................................................. G03F 7/11
(52) U.S. Cl. .................................... 430/273.1; 430/947
(58) Field of Search .............................. 430/273.1, 947

(56) References Cited

U.S. PATENT DOCUMENTS

| | | | | |
|---|---|---|---|---|
| 4,590,287 A | * | 5/1986 | Riediker et al. | 430/947 |
| 4,957,845 A | * | 9/1990 | Isono et al. | |
| 5,301,059 A | * | 4/1994 | Kitaoka et al. | 359/332 |
| 5,922,508 A | * | 7/1999 | Zertani et al. | |
| 6,125,130 A | * | 9/2000 | Schmitt et al. | 372/31 |
| 6,420,089 B1 | * | 7/2002 | Baumann et al. | 430/273.1 |

FOREIGN PATENT DOCUMENTS

| | | | |
|---|---|---|---|
| DE | 100 22 786 A | | 12/2000 |
| EP | 1070990 A1 | * | 1/2001 |
| GB | 1 385 241 A | | 2/1975 |
| JP | 61-117549 A | * | 6/1986 |

OTHER PUBLICATIONS

Shimizu et al, PTO 94–4098, English translation of Japan Kokai Sho 61–117549, United States patent and Trademark Office, Washington, D.C., Aug. 1994, 26 pages.*

Patent Abstracts of JAPAN, vol. 10, No. 300 (P–506), Oct. 14, 1986.

* cited by examiner

*Primary Examiner*—Cynthia Hamilton
(74) *Attorney, Agent, or Firm*—Burns, Doane, Swecker & Mathis, LLP

(57) ABSTRACT

A photosensitive image-recording material comprising a support having provided thereon a photosensitive layer and an oxygen-cutoff layer (protective layer).

3 Claims, No Drawings

PHOTOSENSITIVE IMAGE-RECORDING MATERIAL

FIELD OF THE INVENTION

The present invention relates to a photosensitive image-recording material containing a novel photoinitiator, in particular a photoinitiator which is high sensitive and excellent in stability. More specifically, the present invention relates to a photosensitive image-recording material which is excellent as the material for a lithographic printing plate precursor capable of plate-making by scanning exposure on the basis of digital signals.

BACKGROUND OF THE INVENTION

A PS plate comprising a hydrophilic support having provided thereon a lipophilic photosensitive resin layer has so far been widely used as a lithographic printing plate, and a desired printing plate has been obtained by mask exposure (surface exposure) via a lith film and then dissolving and removing a non-image domain.

Digitized techniques of electronically processing, accumulating and outputting image data using a computer have prevailed in recent years, and various image output systems corresponding to these digitized techniques have been put to practical use. As a result, a computer-to-plate (CTP) technique directly making a printing plate which comprises the step of scanning digitized image data with a highly directional light such as a laser beam without using a lith film is desired. With such a trend, it has become an important technical subject to obtain a printing plate precursor well adapted to this purpose.

As one means to obtain a lithographic printing plate capable of such scanning exposure, the constitution in which a high speed photopolymerizable composition is used as the ink-receptive photosensitive resin layer (hereinafter referred to as "photosensitive layer") provided on a hydrophilic support has so far been proposed and such printing plate is now on the market. The printing plate precursor having this constitution is easy to perform development process and, further, has desired properties as the printing plate and printing properties, e.g., excellent in resolution, adhesion of ink, press life, and smearing prevention.

The photopolymerizable composition fundamentally comprises an ethylenically unsaturated compound, a photopolymerization initiator and a binder resin. The photopolymerization initiator absorbs light to generate an active radical, causes addition polymerization of the ethylenically unsaturated compound and the photosensitive layer is insolubilized, thereby an image is formed. The greatest part of the conventional proposals concerning photopolymerizable compositions capable of scanning exposure have been those disclosing the use of a photopolymerization initiator having high photosensitivity, e.g., those described in Bruce M. Monroe et al., *Chemical Review*, 93,435 (1993) and R. S. Davidson, *Journal of Photochemistry and Biology A: Chemistry*, 73.81 (1993).

However, since a photosensitive lithographic printing plate corresponding to CTP is markedly high speed as compared with conventional PS plates to be exposed via a lith film, a photoreaction is liable to occur even under a safelight, thereby a trouble of fog due to light is easily generated. Therefore, handling of a photosensitive lithographic printing plate under a safelight is restricted such that a safelight must be changed to a darker light and the greatest possible care should be taken to the light leaking in from the outside. For solving this problem of fog due to light, JP-B-7-60268 (the term "JP-B" as used herein means an "examined Japanese patent publication") proposes a technique of providing a protective layer containing a colorant having absorption spectrum near the emission spectrum of a safelight.

However, since the oxygen cutoff effect of the protective layer is reduced according to this method, the lowering of sensitivity is caused with a high speed printing plate.

Besides, it is difficult to select a colorant having appropriate absorption spectrum and the problem of fog cannot be solved without causing the reduction of sensitivity. In particular, a lithographic printing plate corresponding to CTP containing a titanocene photoinitiator (Japanese Patent Application Nos. 11-61559 and 11-221480) is high speed and useful on one hand but a trouble of fog due to light under safelight is liable to occur on the other hand.

SUMMARY OF THE INVENTION

An object of the present invention is to provide a photosensitive image-recording material which is excellent in safelight aptitude without reducing sensitivity, in particular, to provide a photosensitive image-recording material which is excellent as the material for a lithographic printing plate precursor capable of plate-making by scanning exposure on the basis of digital signals.

In a first aspect, the present invention relates to a photosensitive image-recording material which comprises a support having provided thereon a photosensitive layer and an oxygen-cutoff layer in this order from the support, wherein a colored layer for cutting off lights other than the light of the wavelength of the exposure light source is provided between the photosensitive layer and the oxygen-cutoff layer or as the outermost layer on the oxygen-cutoff layer.

As a result of eager investigation to solve the above problem, the present inventors have found that it becomes possible to maintain an oxygen cutoff property, prevent sensitivity from being reduced, and contain a filter dye in high concentration by the provision of a colored layer containing a filter dye besides an oxygen cutoff layer, as a result, a photosensitive image-recording material more excellent in safelight aptitude can be obtained. Thus, the present invention has been accomplished.

In a second aspect, the present invention relates to a photosensitive image-recording material which comprises a support having provided thereon a photosensitive layer, and a protective layer containing a colorant having a main absorption spectrum in a wavelength region of an emission spectrum of a safelight, wherein the photosensitive layer contains at least a titanocene photoinitiator, and the absorption spectrum of the colorant in the protective layer shows the optical density (OD) of 1.0 or more in the wavelength region of from 520 to 540 nm, and the optical density (OD) of 0.3 or less in the wavelength region of 500 nm or less of the exposure light source.

As a result of eager investigation to solve the above problem, the present inventors have found that the cause of the light fog under safelight when a titanocene photoinitiator is used results from the secondary absorption of the photoinitiator (near 450 to 550 nm), and a photosensitive image-recording material excellent in safelight aptitude can be obtained without reducing sensitivity by adding a colorant having absorption spectrum of sufficient optical density (OD) near the secondary absorption and having no or little absorption in exposure wavelength (500 nm or less) to a protective layer. Thus, the present invention has been accomplished.

Moreover, in the photosensitive image-recording material according to the second aspect of the present invention, light fog can be effectively avoided and it becomes possible to handle the material under a brighter safelight than those so far been used by making both of the absorption spectrum of a sensitizing dye and the wavelength of an exposure light source shorter than the emission spectrum of a safelight. The generation of light fog under a safelight due to a titanocene compound highly sensitized by a sensitizing dye is effectually avoidable by making the absorption spectrum of a sensitizing dye sufficiently shorter than the emission spectrum of a safelight so that both spectra do not overlap or hardly overlap with each other.

DETAILED DESCRIPTION OF THE INVENTION

The present invention will be described in detail below.

The photosensitive image-recording material according to the present invention comprises a support having provided thereon (A) an oxygen-cutoff layer (it is also referred to as a protective layer), (B) a photosensitive layer, and, optionally, (C) a colored layer. These components will be specifically described below.

(A) Oxygen Cutoff Layer (also Referred to as a Protective Layer)

Since in a lithographic printing plate precursor for scanning exposure, which is a preferred usage of the photosensitive image-recording material of the present invention, exposure is in general performed in the air, it is preferred to provide an oxygen cutoff layer (a protective layer) on the layer of a photosensitive composition (hereinafter referred to as merely "a photosensitive layer"). The protective layer prevents low molecular compounds, such as oxygen in the air and basic substances which hinder image-forming reaction caused by exposure in the photosensitive layer, from mixing into the photosensitive layer and makes the exposure in the air possible. Accordingly, the characteristics which are required of the protective layer are that the protective layer has low permeability of a low molecular compound such as oxygen, does not substantially hinder the transmission of light for exposure, has excellent adhesion with the photosensitive layer or the colored layer, and can be easily removed after exposure during development process. Such contrivances have so far been tried and disclosed in detail in U.S. Pat. No. 3,458,311 and JP-A-55-49729 (the term "JP-A" as used herein means an "unexamined published Japanese patent application").

As the materials for the protective layer, watersoluble high molecular weight compounds comparatively excellent in crystallizability are preferably used, specifically, water-soluble polymers, e.g., polyvinyl alcohol, vinyl alcohol/vinyl phthalate copolymers, vinyl acetate/vinyl alcohol/vinyl phthalate copolymers, vinyl acetate/crotonic acid copolymers, polyvinyl pyrrolidone, acidic celluloses, gelatin, gum arabic, polyacrylic acid and polyacrylamide can be exemplified and they can be used alone or as a mixture. Of these compounds, when polyvinyl alcohol is used as a main component, the best results can be obtained in fundamental characteristics such as exclusion of oxygen and removal of the protective layer by development.

The polyvinyl alcohols for use in the protective layer may be partially substituted with ester, ether and/or acetal so long as they contain unsubstituted vinyl alcohol units for obtaining necessary oxygen-cutoff property and water solubility. Also, a part of the polyvinyl alcohols may have other copolymer components. As specific examples of the polyvinyl alcohols, those from 71 to 100% of which is hydrolyzed and having a molecular weight of from 300 to 2,400 can be exemplified. Specifically, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (manufactured by Kuraray Co., Ltd.) can be exemplified.

The components of the protective layer (the selection of PVA and the use of additives), the coating amount, etc., are selected taking fogging characteristic, adhesion and scratch resistance into consideration besides the oxygen-cutting off property and the removal by development. In general, the higher the hydrolyzing rate of the PVA to be used (the higher the content of the unsubstituted vinyl alcohol units in the protective layer) and the thicker the layer thickness, the higher is the oxygen-cutoff property, thus advantageous in the point of sensitivity. However, too high an oxygen-cutoff property results in the generation of unnecessary polymerization reaction during manufacture and live storage of the material, or generation of unnecessary fog and fattening of image lines at image exposure. The oxygen permeation coefficient of the protective layer is preferably from $1 \times 10^{-16}$ to $1 \times 10^{-10}$ $cm^3 \cdot cm/cm^2 \cdot sec \cdot cmHg$, particularly preferably from $1 \times 10^{-15}$ to $1 \times 10^{-11}$ $cm^3 \cdot cm/cm^2 \cdot sec \cdot cmHg$. The molecular weight of the above (co)polymers is generally from 2,000 to 10,000,000, preferably from 20,000 to 3,000,000.

As other components of the protective layer, several wt % based on the (co)polymer of glycerin, dipropylene glycol, etc., can be added to provide flexibility to the protective layer. Further, anionic surfactants, e.g., sodium alkylsulfate, sodium alkylsulfonate, etc.; ampholytic surfactants, e.g., alkylaminocarboxylate, alkylaminodicarboxylate, etc.; and nonionic surfactants, e.g., polyoxyethylenealkylphenyl ether, etc. can be added to the protective layer in an amount of several wt % based on the (co)polymer. The protective layer has a thickness of preferably from 0.5 to 5 $\mu m$, especially preferably from 1 to 3 $\mu m$.

The adhesion of the protective layer with the image domain and scratch resistance are also extremely important in handling a printing plate, i.e., when a hydrophilic layer comprising water-soluble polymers is laminated on a lipophilic polymer layer, peeling off of the film due to insufficient adhesion is liable to occur, and the peeled part causes such a defect as film hardening failure by polymerization hindrance due to oxygen. Various countermeasures have been proposed for improving the adhesion between the hydrophilic layer and the lipophilic layer. For example, it is disclosed in U.S. Pat. Nos. 292,501 and 44,563 that sufficient adhesion property can be obtained by mixing from 20 to 60 wt % of an acryl-based emulsion or a water-insoluble vinyl pyrrolidone/vinyl acetate copolymer to a hydrophilic polymer mainly comprising polyvinyl alcohol and laminating the resulting product on a polymer layer. Any of these well-known techniques can be applied to the protective layer of the present invention. The coating methods of these protective layers are disclosed in detail, e.g., in U.S. Pat. No. 3,458,311 and JP-A-55-49729.

In the second aspect of the present invention, dyes or pigments can be used as a colorant in the protective layer and it is particularly preferred to use the following water-soluble dyes such as cationic dyes, reactive dyes, acidic dyes and direct dyes alone or in combination. Specifically, nitroso dyes, e.g., Naphthol Green B; nitro dyes, e.g., Naphthol Yellow S and Polar Yellow Brown; azo dyes, e.g., Diachrone Scarlet RN, Diamira Red B, Diamira Brilliant Red BB, Diamira Brilliant Violet 5R, Diamira Brilliant Red GG, Diamira Brilliant Orange FR, Diamira Brilliant Orange 3R, Diacryl Brilliant Red GTL-N, Diacryl Red GL-N, Diacryl Brilliant Red GRL-N, Victoria Scarlet 3R, Sulfone Acid Blue R, Supramine Red GG, Supramine Red B, Supramine Blue R, Polar Red G, Polar Orange R, Metachrome Red 5G, Metachrome Brilliant Blue BL, Supranol Orange RR and Supranol Brilliant Red; thiazole dyes, e.g., Diacryl Red CS-N, Thiazine Red R, Sirius Scarlet B and Thioflavine T; diphenylmethane dyes, e.g., Auramine; triphenylmethane dyes, e.g., Victoria Pure Blue BOH, Crystal Violet, Methyl Violet, Ethyl Violet, Spirit Blue, Brilliant Blue R, Acid Violet 6B, Acid Fuchsine and Malachite Green; xanthene dyes, e.g., Pyronine G, Rhodamine S, Eosine G, Eosine Y, Erythrocin, Rose Bengale B, Rhodamine B and Rhodamine 3GO; acridine dyes, e.g., Acridine Orange 2G and Euchrysine 2GNX; azine dyes, e.g., Neutral Violet, Neutral Red, Azocarmine G, Safranine T and Indocyanine B; oxazine dyes, e.g., Meldola's Blue, Nile Blue A and Gallocyanine; dioxazine dyes, e.g., Sirius Light Blue FFRL and Sirius Light Blue F3GL; thiazine dyes e.g., Methylene Blue, Methylene Green B and Azulene C; anthraquinone dyes, e.g. Diacid Light Blue BR, Alizarine Direct Violet EFF, Supracen Violet 4BF, Alizarine Sky Blue B, Alizarine Cyanine Green G, Carbolan Green G, Alizarine Saphirol B, Alizarine Cyanine Green 5G, Alizarine Brilliant Pure Blue R, Alizarine Brilliant Light Red 4B and Alizarine Uranol 2B; phthalocyanine dyes, e.g., Heliogen Blue SBP; and cyanine dyes, e.g., Diacryl Brilliant Red 3GN, Diacryl Brilliant Pink GN, Diacryl Brilliant Pink RN and Diacryl Brilliant Red 6BN can be used in the present invention.

Especially preferred dyes are those having high water solubility (30 mg/ml or more) and the ratio of OD in the long wavelength (from 520 to 540 nm)/OD in the short wavelength (500 nm or less) of 3 or more, more preferably 5 or more. As such dyes, xanthene dyes, e.g., Rhodamine B and Rose Bengale, and triphenylmethane dyes, e.g., Methyl Violet 2B and Brilliant Blue R can be exemplified.

Dyes can be selected according to various purposes but they should be soluble in the aqueous solution of the (co)polymer constituting the main component of the protective layer composition, and OD in the wavelength region of from 520 to 540 nm of the absorption spectra of dyes in the protective layer should be 1.0 or more and OD in the wavelength region of the exposure light source of 500 nm or less should be 0.3 or less. The desired OD can be obtained by combining two or more dyes. The absorption spectra of colorants show OD in the wavelength region of from 520 to 540 nm of preferably 2.0 or more, more preferably 2.5 or more, and OD in the wavelength region of the exposure light source of preferably 0.2 or less, more preferably 0.1 or less. Excellent sensitivity can be obtained without generating safelight fog when these conditions are satisfied.

The above-described water-soluble dyes can be added in an amount of from 0.1 to 20 wt % based on the aqueous solution of the (co)polymer constituting the main component of the protective layer composition, but the optimal amount is such an amount that the protective layer coated on the surface of the colored photosensitive composition layer has sufficient visibility, i.e., such an amount that the optical reflection density of the protective layer surface of the photopolymerizable photosensitive lithographic printing plate becomes from 0.5 to 3.0, more preferably from 0.8 to 1.5. However, the reflection density varies largely depending upon the concentration and the hue of the colorant in a photosensitive composition. That is, when a water-soluble dye for coloring the protective layer and the colorant in a photosensitive composition are in the relationship of complementary colors, the optical density of the surface of the photosensitive lithographic printing plate becomes synergistically high, therefore, a relatively small amount of dye is sufficient to be added to the protective layer. Accordingly, since the film condition of the protective layer coated on the surface of the photosensitive composition layer is sufficiently confirmable when the optical density of a simple protective layer is from 0.05 to 1.0, the more preferred addition amount of the water-soluble dye required for coloring the protective layer is from 0.5 to 10 wt % based on the aqueous solution of the (co)polymer of the protective layer composition.

(B) Photosensitive Layer

In the first aspect of the present invention, the photosensitive layer contains, as the essential component, at least one of (B-1) a photopolymerization initiator and (B-2) a compound which undergoes a reaction by at least either a radical or an acid to change and retain at least either of physical or chemical characteristics thereof, and further, if necessary, (B-3) a binder polymer and (B-4) other components. These components will be specifically described below.

(B-1) Photopolymerization initiator

As the photopolymerization initiator for use in the present invention, well-known photopolymerization initiators disclosed in patents and literature and the combination of two or more photopolymerization initiators can be arbitrarily selected according to the wavelength of the light source to be used. Further, there are cases where the sensitivity is increased by using photopolymerization initiators in combination with appropriate sensitizing dyes. In such a case, it is more preferred to use sensitizing dyes together with photopolymerization initiators.

As the examples of photopolymerization initiators, e.g., benzoin, benzoin alkyl ether (JP-B-47-6416), benzophenone (J. P. Fouassier, J. F. Rabek, *Radiation Curing in Polymer Science and Technology,* pp. 77 to 117 (1993)), anthraquinone, benzyl, Michler's ketone, composites comprising biimidazole and Michler's ketone, thioxanthones (JP-B-63-61850), coumarins (JP-B-59-42864), series comprising mono-, bis- or triacylphosphine compounds and aromatic carbonyl compounds (Japanese Patent No. 2973130, EP-A-0825201, WO 97/31051, Japanese Patent No. 2777807, U.S. Pat. No. 5,723,512, German Patent Application (OLS) No. 19,618,720, U.S. Pat. No. 5,534,559, JP-A-7-278215, U.S. Pat. No. 5,721,292, Japanese Patent No. 92604172, JP-A-3-101686, JP-A-4-220404), and series using azinium compounds as the photopolymerization initiator can be preferably used in the present invention.

When a visible light of 450 nm or more, an Ar laser, a second harmonic generator of a semiconductor laser, or an SHG-YAG laser is used as a light source, too, various photopolymerization initiators are suggested. For example, a certain kind of photoreductive dyes as disclosed in U.S. Pat. No. 2,850,445, e.g., Rose Bengale, Eosine and Erythrosine, or series comprising a combination of a dye and a photopolymerization initiator, e.g., a composite initiator comprising a dye and amine (JP-B-44-20189), series comprising a combination of hexaarylbiimidazole, a radical generator and a dye (JP-B-45-37377), series comprising hexaarylbiimidazole and p-dialkylaminobenzylidene ketone (JP-B-47-2528, JP-A-54-155292), series comprising a cyclic cis-α-dicarbonyl compound and a dye (JP-A-48-84183), series comprising cyclic triazine and a merocyanine dye (JP-A-54-151024), composite series comprising 2,4,6-tris(trichloromethyl)-1,3,5-triazine and a thiapyrylium derivative, series comprising 3-ketocoumarin and an activator (JP-A-52-112681, JP-A-58-15503), series comprising biimidazole, a styrene derivative and thiol (JP-A-59-140203), series comprising an organic peroxide and a dye (JP-A-59-1504, JP-A-59-140203, JP-A-59-189340, JP-A-62-174203, JP-B-62-1641, U.S. Pat. No. 4,766,055), series comprising a dye and an active halide compound (JP-A-63-1718105, JP-A-63-258903, Japanese Patent Application No. 2-63054), series comprising a dye and a borate compound (JP-A-62-143044, JP-A-62-150242, JP-A-64-13140, JP-A-64-13141, JP-A-64-13142, JP-A-64-13143, JP-A-64-13144, JP-A-64-17048, JP-A-1-229003, JP-A-1-298348, JP-A-1-138204), series comprising a dye having a rhodanine ring and a radical generator (JP-A-2-179643, JP-A-2-244050), series comprising titanocene and a 3-ketocoumarin dye (JP-A-63-221110), series comprising a combination of titanocene, a xanthene dye, and an addition polymerizable ethylenically unsaturated compound having an amino group or a urethane group (JP-A-4-221958, JP-A-4-219756), series comprising titanocene and a specific merocyanine dye (corresponding to a sensitizing dye) (JP-A-6-295061), and series comprising titanocene and a dye having a benzopyran ring (JP-A-8-334897) can be exemplified.

The preferred photopolymerization initiator according to the present invention contains at least one titanocene compound. Titanocene compounds for use in the present invention are not particularly limited and any compound can be used so long as it can generate active radicals when irradiated with light alone or in the coexistence with the above-described sensitizing dye. For example, well-known compounds disclosed in JP-A-59-152396, JP-A-61-151197, JP-A-63-41483, JP-A-63-41484, JP-A-2-249, JP-A-2-291, JP-A-3-27393, JP-A-3-12403 and JP-A-6-41170 can be arbitrarily used.

More specifically, dicyclopentadienyl-Ti-dichloride, dicyclopentadienyl-Ti-bisphenyl, dicyclopentadienyl-Ti-bis-2,3,4,5,6-pentafluorophen-1-yl (hereinafter sometimes referred to as "T-1"), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, and bis(cyclopentadienyl)-bis(2,6-difluoro-3-(pir-1-yl)phenyl)titanium (hereinafter sometimes referred to as "T-2") can be exemplified.

As the dyes having a sensitizing function in particular in the vicinity of 4,000 nm, the dye having a carbazole skeleton disclosed in Japanese Patent Application No. 11-221480 and the dye having an oxazolidine skeleton disclosed in Japanese Patent Application No. 11-280204 are especially preferably used in combination with a titanocene photopolymerization initiator.

Concerning the titanocene compounds according to the present invention, similarly to the above sensitizing dyes, various chemical modifications can be performed for the purpose of further improving the characteristics of the photosensitive layer. For example, a method of bonding titanocene compounds to sensitizing dyes, addition polymerizable unsaturated compounds and other radical-generating parts, a method of introducing hydrophilic moieties, a method of introducing substituents for the purpose of compatibility improvement and crystal precipitation prevention, a method of introducing substituents for the purpose of adhesion improvement, and a method of polymerization can be used.

Concerning the usage of these titanocene compounds, it can also be selected arbitrarily according to the designs of the performances of photosensitive materials in the same way as the later-described addition polymerizable compounds and the sensitizing dyes described above. For example, the compatibility with a photosensitive layer can be increased by using two or more titanocene compounds in combination. In general, it is preferred to use a large amount of titanocene compounds from the point of photosensitivity. The amount of from 0.5 to 80 weight parts, preferably from 1 to 50 weight parts, per 100 weight parts of the photosensitive layer components is sufficient to obtain satisfactory photosensitivity. On the other hand, when the use of a photosensitive layer under a yellow lamp and a white lamp is taken into consideration, which is a primary object of the present invention, the use amount of titanocene compounds is preferably small from the point of fogging due to light in the vicinity of 500 nm. Even if the amount of titanocene compounds is reduced to 6 weight parts or less, further 1.9 weight parts or less, and still further 1.4 weight parts or less, sufficient photosensitivity can be obtained by the combined use with the sensitizing dye.

(B-2) Compound which Undergoes Reaction by at Least Radical or Acid to Change and Retain at Least Either of Physical or Chemical Characteristics Thereof A compound (B-2) according to the present invention which undergoes a reaction by at least either a radical or an acid to change and retain at least either of physical or chemical characteristics thereof is a compound whose physical or chemical characteristics are changed and retained by the function of the active seed generated by the photoreaction of the above-described photoinitiator. Component (B-2) is not particularly limited and any arbitrary compound can be used so long as it has such a property. For example, the above-exemplified compounds as initiators per se have such a property in many cases. The characteristics of component (B-2) which are changed by the function of a radical, an acid and/or a base generated from a photoinitiator include physical characteristics of the molecule such as absorption spectrum (color), chemical structure and polarizability, and physical characteristics of the material such as solubility, strength, refractive index, flowing property, and adhesive property.

For example, when a compound the absorption spectrum of which changes by pH, such as a pH indicator, is used as component (B-2) to generate an acid or a base from a photoinitiator, it is possible to vary the tint of the exposed area alone and such a composition is useful as an image-forming material. Similarly, when a compound the absorption spectrum of which changes by an oxidation reaction, reduction reaction or a nucleophilic addition reaction is used as component (B-2), an image can be formed as a result of the oxidation or the reduction caused by a radical generated from a photoinitiator. Such examples are described, e.g., in *J. Am. Chem. Soc.,* 108, 128 (1986), *J. Imaging Sci.,* 30, 215 (1986) and *Israel J. Chem.,* 25 264 (1986).

Further, by combining an addition polymerizable compound or a compound capable of polycondensation, as component (B-2), with a photoinitiator, it is possible to form a photo-curable resin or a negative photopolymer.

As component (B-2), it is possible to use a radical polymerizable compound (e.g., a compound having an ethylenically unsaturated bond), a cationic polymerizable compound (e.g., an epoxy compound, a vinyl ether compound, a methylol compound), and an anionic polymerizable compound (e.g., an epoxy compound), and examples of these compounds are described, e.g., in, compiled by the Photopolymer Meeting, *Photopolymer Handbook,* Kogyo Chosa-Kai (1989), and *Kobunshi (Polymer Compounds),* 45, 786

(1996). Compositions comprising thiol compounds as component (B-2) and photo-radical generators in combination are also well known.

It is also useful to combine acid-decomposable compounds, as component (B-2), with light/acid generating agents. For example, materials in which a high molecular compound whose side chain and main chain are decomposed by an acid is used, and the solubility, hydrophilicity and hydrophobicity thereof are changed by light are widely put to practical use as photodecomposable photosensitive resins and positive photopolymers. Specific examples of these compounds are described, e.g., in ACS. Symp. Ser., 242, 11 (1984), JP-A-60-3625, U.S. Pat. Nos. 5,102,771, 5,206,317, 5,212,047, JP-A-4-26850, JP-A-3-1921731, JP-A-60-10247 and JP-A-62-40450.

Component (B-2), which is an addition polymerizable compound and an excellent component for one object of the present invention of providing a high speed lithographic printing plate will be described in detail below.

An addition polymerizable compound having at least one ethylenically unsaturated double bond which is preferably used as component (B-2) is selected from among the compounds having at least one, preferably two or more, ethylenically unsaturated bond(s) at terminals. Such compounds are well known in the industry and they can be used in the present invention with no particular limitation. Such compounds have the chemical form of, e.g., a monomer, a prepolymer, i.e., a dimer, a trimer, and an oligomer or a mixture and a copolymer of them.

As examples of monomers and copolymers thereof, unsaturated carboxylic acids (e.g., acrylic acid, methacrylic acid, itaconic acid, crotonic acid, isocrotonic acid, maleic acid, etc.), and esters and amides thereof can be exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of unsaturated carboxylic esters and amides having a nucleophilic substituent such as a hydroxyl group, an amino group and a mercapto group with monofunctional or polyfunctional isocyanates and epoxies, and the dehydration condensation reaction products of these compounds with monofunctional or polyfunctional carboxylic acids are also preferably used. The addition reaction products of unsaturated carboxylic esters and amides having electrophilic substituents such as an isocyanato group and an epoxy group with monofunctional or polyfunctional alcohols, amines and thiols, and the substitution reaction products of unsaturated carboxylic esters and amides having separable substituents such as a halogen group and a tosyloxy group with monofunctional or polyfunctional alcohols, amines and thiols are also preferably used. As another example, it is also possible to use compounds in which the above unsaturated carboxylic acids are replaced with unsaturated phosphonic acid, styrene, vinyl ether, etc.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, etc.

As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane, etc.

As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

As crotonates, examples include ethylene glycol dicrotonate, tetramethylene glycol dicrotonate, pentaerythritol dicrotonate, sorbitol tetradicrotonate, etc.

As isocrotonates, examples include ethylene glycol diisocrotonate, pentaerythritol diisocrotonate, sorbitol tetraisocrotonate, etc.

As maleates, examples include ethylene glycol dimaleate, triethylene glycol dimaleate, pentaerythritol dimaleate, sorbitol tetramaleate, etc.

As examples of other esters, e.g., aliphatic alcohol esters disclosed in JP-B-46-27926, JP-B-51-47334 and JP-A-57-196231, esters having an aromatic skeleton disclosed in JP-A-59-5240, JP-A-59-5241 and JP-A-2-226149, and esters having an amino group disclosed in JP-A-1-165613 can also be preferably used in the present invention.

Further, the mixtures of the above-described ester monomers can also be used.

Further, specific examples of amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetrisacrylamide, xylylenebis-acrylamide, xylylenebis-methacrylamide, etc.

As other preferred amide monomers, those having cyclohexylene structure disclosed in JP-B-54-21726 can be exemplified.

Further, urethane-based addition polymerizable compounds which are obtained by the addition reaction of an isocyanate and a hydroxyl group are also preferably used in the present invention, and as the specific example, as is disclosed in JP-B-48-41708, a vinyl urethane compound having two or more polymerizable vinyl groups in one molecule can be exemplified, which is obtained by the addition of a vinyl monomer having a hydroxyl group represented by the following formula (V) to a polyisocyanate compound having two or more isocyanate groups in one molecule.

$$CH_2=C(R)COOCH_2CH(R')OH \qquad (V)$$

wherein R and R' each independently represents H or $CH_3$.

Further, urethane acrylates as disclosed in JP-A-51-37193, JP-B-2-32293 and JP-B-2-16765, and urethane compounds having an ethylene oxide skeleton as disclosed in JP-B-58-49860, JP-B-56-17654, JP-B-62-39417, and JP-B-62-39418 are also preferably used in the present invention.

Moreover, extremely high speed photosensitive compositions can be obtained by using addition polymerizable compounds having amino structure and sulfide structure in the molecule as disclosed in JP-A-63-277653, JP-A-63-260909 and JP-A-1-105238.

As other examples of component (B-2), polyfunctional acrylates and methacrylates, such as polyester acrylates, and epoxy acrylates obtained by reacting epoxy resins with (meth)acrylic acids as disclosed in JP-A-48-64183, JP-B-49-43191 and JP-B-52-30490 can be exemplified. Furthermore, specific unsaturated compounds as disclosed in JP-B-46-43946, JP-B-1-40337 and JP-B-1-40336, and vinyl sulfonic acid-based compounds as disclosed in JP-A-2-25493 can also be exemplified. Further, according to cases, structures containing a perfluoroalkyl group as disclosed in JP-A-61-22048 are preferably used. Moreover, photo-curable monomers and oligomers introduced into Bulletin of Nihon Setchaku Kyokai, Vol. 20, No. 7, pp. 300 to 308 (1984) can be used as well.

The details of the usage of the addition polymerizable compound, e.g., what structure is to be used, whether the compound is to be used alone or in combination, and what an amount is to be used, can be optionally set up according to the final design of the characteristics of the photosensitive material. For example, the conditions are selected from the following viewpoint.

From the point of photosensitive speed, the structure containing many unsaturated groups per molecule is preferred, and in many cases bifunctional or more functional groups are preferred. For increasing the strength of an image domain, i.e., a cured film, trifunctional or more functional groups are preferred, further, it is also effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength on one hand, they are in some cases not preferred in the point of development speed and the precipitation in a developing solution on the other hand. The selection and usage of the addition polymerizable compound are important factors for the compatibility with other components (e.g., a binder polymer, an initiator, a colorant, etc.) in the photosensitive layer and dispersibility, for example, sometimes compatibility can be improved by using a low purity compound or two or more compounds in combination. Further, it is also possible to select a compound having specific structure for the purpose of improving the adhesion property of a support and an overcoat layer.

Concerning the compounding ratio of the addition polymerizable compound in the photosensitive layer, the more the amount, the higher is the sensitivity, but too large an amount sometimes results in disadvantageous phase separation, problems in manufacturing process due to the stickiness of the photosensitive layer (e.g., manufacturing failure resulting from the transfer and adhesion of the photosensitive material components), and precipitation from a developing solution. From these points of view, a preferred compounding ratio of the addition polymerizable compound is in many cases from 5 to 80 wt %, preferably from 25 to 75 wt %, based on the entire composition components. The addition polymerizable compound may be used alone or in combination of two or more. In addition, appropriate structure, compounding ratio and addition amount of the addition polymerizable compound can be arbitrarily selected taking into consideration the degree of polymerization hindrance due to oxygen, resolution, fogging property, refractive index variation and surface adhesion. Further, the layer constitution and the coating method of undercoating and overcoating can be performed according to circumstances.

(B-3) Binder Polymer

When the photosensitive composition according to the present invention is applied to a lithographic printing plate, which is a preferred embodiment of the present invention, it is preferred to further contain a binder polymer in a photosensitive layer. As the binder polymer, linear organic high molecular polymers are preferably used. Any compound can be used as such "linear organic high molecular polymers". Water- or weak alkali water-soluble or swelling linear organic high molecular polymers which make water development or weak alkali water development possible are preferably selected. Linear organic high molecular polymers are selected and used not only as the film-forming agent of the composition but according to the purpose as a water developer, a weak alkali water developer or an organic solvent developer. For example, when water-soluble linear organic high molecular polymers are used, water development becomes possible. As such linear organic high molecular polymers, addition polymers having a carboxylic acid group at the side chain, e.g., the polymers disclosed in JP-A-59-44615, JP-B-54-34327, JP-B-58-12577, JP-B-54-25957, JP-A-54-92723, JP-A-59-53836, and JP-A-59-71048, i.e., a methacrylic acid copolymer, an acrylic acid copolymer, an itaconic acid copolymer, a crotonic acid copolymer, a maleic acid copolymer and a partially esterified maleic acid copolymer, can be exemplified. Acidic cellulose derivatives having a carboxylic acid group at the side chain can also be used. Besides the above, the polymers obtained by adding a cyclic acid anhydride to an addition polymer having a hydroxyl group are also useful.

Of these polymers, in particular, copolymers of [benzyl (meth)acrylate/(meth)acrylic acid/other addition polymerizable vinyl monomer according to necessity] and copolymers of [allyl (meth)acrylate/(meth)acrylic acid/other addition polymerizable vinyl monomer according to necessity] are excellent in the balance of film strength, sensitivity and developability hence advantageously used in the present invention.

Since the urethane-based binder polymers having an acid radical disclosed in JP-B-7-12004, JP-B-7-120041, JP-B-7-120042, JP-B-8-12424, JP-A-63-287944, JP-A-63-287947, JP-A-1-271741, and Japanese Patent Application No. 10-116232 are very excellent in strength, they are advantageously used in the point of press life and low exposure aptitude.

The binder having an amido group disclosed in JP-A-11-171907 has both excellent developability and film strength and preferably used.

In addition to the above, polyvinyl pyrrolidone and polyethylene oxide are useful as the water-soluble linear organic high molecular polymer. For increasing cured film strength, alcohol-soluble nylon, polyethers of 2,2-bis(4-hydroxyphenyl)propane and epichlorohydrin are also useful.

These linear organic high molecular polymers can be mixed in an arbitrary amount into the entire composition, but when the amount exceeds 90 wt %, image strength, etc., are adversely influenced. A preferred amount is from 30 to 85 wt %. The weight ratio of the compound having a photopolymerizable ethylenically unsaturated double bond to the linear organic high molecular polymer is preferably within the range of from 1/9 to 7/3.

In a preferred embodiment of the present invention, the binder polymer to be used is substantially water-insoluble and alkali-soluble, by which the organic solvents which are environmentally undesirable as the developing solution can be done without, or the use amount can be limited to an extremely small amount. In such a usage, the acid value (an acid content per g of the polymer represented in a chemical equivalent number) and the molecular weight of the binder polymer are appropriately selected from the viewpoint of the image strength and developability. The acid value is preferably from 0.4 to 3.0 meq/g, more preferably from 0.6 to 2.0 meq/g, and the molecular weight is preferably from 3,000 to 500,000, more preferably from 10,000 to 300,000.

(B-4) Other Components

Other components suitable for other usages and manufacturing methods can be arbitrarily used in the photosensitive layer of the present invention. Preferred additives are described below.

(B-4-1) Co-sensitizer

Sensitivity of the photosensitive layer can further be increased by using certain kinds of additives (these additives are hereinafter referred to as "co-sensitizers"). The mechanisms of their functions are not clear but it is presumed to be based on the following chemical processes. That is, various intermediate active seeds (a radical, a peroxide, an oxidizing agent, a reducing agent, etc.) which are generated during the course of the photoreaction initiated by the light absorption of the above-described initiator and the succeeding addition polymerization reaction react with a co-sensitizer to thereby form a new active radical. Co-sensitizers can be classified into the categories of (a) a compound capable of generating an active radical by reduction, (b) a compound capable of generating an active radical by oxidation, and (c) a compound which reacts with a radical of lower activity and converts into a higher active radical, or functions as a chain transfer agent. However, in many cases, there is no common view as to what compound belongs to what category.

(a) Compound which Generates Active Radical by Reduction

A Compound Having a Carbon-halogen Bond:

It is thought that a carbon-halogen bond is cleaved reducibly to generate an active radical. Specifically, for example, trihalomethyl-s-triazines and trihalomethyl oxadiazoles are preferably used.

A Compound Having a Nitrogen-nitrogen Bond:

It is thought that a nitrogen—nitrogen bond is cleaved reducibly to generate an active radical. Specifically, for example, hexaaryl-biimidazoles are preferably used.

A Compound Having an Oxygen-oxygen Bond:

It is thought that an oxygen—oxygen bond is cleaved reducibly to generate an active radical. Specifically, for example, organic peroxides are preferably used.

An Onium Compound:

It is thought that a carbon-hetero bond and oxygen-nitrogen bond are cleaved reducibly to generate an active radical. Specifically, for example, diaryliodoniums, triarylsulfoniums, N-alkoxypyridinium (azinium) salts are preferably used.

Ferrocene, Iron Arene Complexes:

An active radical is generated reducibly.

(b) Compound Which Generates Active Radical by Oxidation

An Alkylate Complex:

It is thought that a carbon-hetero bond is cleaved oxidatively to generate an active radical. Specifically, for example, triarylalkylborates are preferably used.

An Alkylamine Compound:

It is thought that the C—X bond on the carbon adjacent to the nitrogen atom is cleaved to generate an active radical by oxidation. An oxygen atom, a carboxyl group, a trimethylsilyl group, a benzyl group, etc., are preferred as X. Specifically, for example, ethanolamines, N-phenylglycines, N-trimethylsilylmethylanilines can be exemplified.

A Sulfur-containing Compound, a Tin-containing Compound:

The above compounds in which the nitrogen atom of the amines is substituted with a sulfur atom or a tin atom can generate an active radical by similar a function. Further, it is also known that a compound having an S—S bond is also sensitized by S—S cleavage.

An α-substituted Methylcarbonyl Compound:

An active radical can be generated by the cleavage of the bond between carbonyl-α carbon by oxidation. The compound in which the carbonyl is substituted with oxime ether also shows the same function. Specifically, 2-alkyl-1-[4-(alkylthio)phenyl]-2-morpholinopuronone-1 compounds, and oxime ethers obtained by reacting 2-alkyl-1-[4-(alkylthio)phenyl]-2-morpholinopuronone-1 compounds with hydroxylamines and then etherifying the N—OH can be exemplified.

Sulfinates:

An active radical can be generated reducibly. Specifically, sodium arylsulfinate, etc., can be exemplified.

(c) Compound Which Reacts with Radical and Converts into Higher Active Radical, or Functions as Chain Transfer Agent:

For example, compounds having SH, PH, SiH, GeH in the molecule are used. They can generate a radical by donating hydrogen to a low active radical seed, or they can generate a radical by eliminating a proton after being oxidized. Specifically, for example, 2-mercaptobenzimidazoles can be exemplified.

Many more specific examples of the co-sensitizers are disclosed, e.g., in JP-A-9-236913 as the additive aiming at improving sensitivity. A part of these examples are shown below but the present invention is not limited thereto.

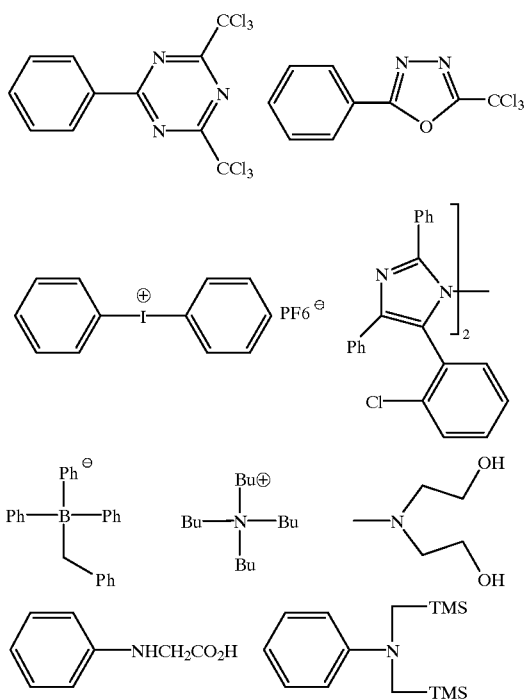

-continued

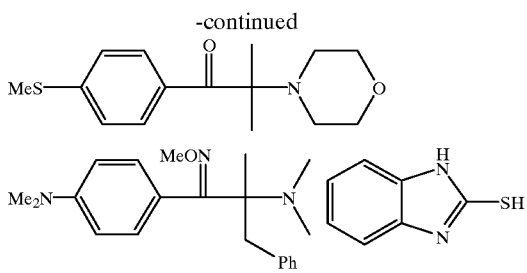

With respect to these co-sensitizers, similarly to the above sensitizing dyes, various chemical modifications can be performed for improving the characteristics of the photosensitive layer. For example, methods of bonding the co-sensitizers to sensitizing dyes, activators, addition polymerizable unsaturated compounds and other parts, introduction of hydrophilic moieties, improvement of compatibility, introduction of substituents for crystal precipitation prevention, introduction of substituents for adhesion improvement, and polymerization can be utilized.

These co-sensitizers may be used alone or two or more may be used in combination. The addition amount of the co-sensitizer is appropriately from 0.05 to 100 weight parts, preferably from 1 to 80 weight parts, and more preferably from 3 to 50 weight parts, per 100 weight parts of the compound having an ethylenically unsaturated double bond.

(B-4-2) Polymerization Inhibitor

Besides the above basic components, it is preferred to use a small amount of thermal polymerization inhibitor for inhibiting unnecessary thermal polymerization of a compound having an ethylenically unsaturated bond during production and storage of the photosensitive composition of the present invention. As the appropriate thermal polymerization inhibitors, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine primary cerium salt can be exemplified. The addition amount of the thermal polymerization inhibitor is preferably from about 0.01 wt % to about 5 wt % based on the weight of the entire compositions. Further, if necessary, higher fatty acid derivatives, such as behenic acid and behenic acid amide, may be added and localized on the surface of the photosensitive layer during drying process after coating for the purpose of inhibiting polymerization hindrance due to oxygen. The addition amount of the higher fatty acid derivatives is preferably from about 0.5 wt % to about 10 wt % based on the weight of the entire compositions.

(B-4-3) Colorant, etc.

Dyes or pigments may be added to the photosensitive layer for the purpose of coloring the photosensitive layer. The so-called plate-inspection property, e.g., visibility as the printing plate after plate-making, and the aptitude to an image densitometer can be improved due to the addition of colorants. Since many of dyes are liable to reduce the sensitivity of a photopolymerizable photosensitive layer, the use of pigments is particularly preferred as the colorant. Specific examples of the colorants include, e.g., pigments such as phthalocyanine pigments, azo pigments, carbon black and titanium oxide, and dyes such as Ethyl Violet, Crystal Violet, azo dyes, anthraquinone dyes and cyanine dyes. The addition amount of the dye and the pigment is preferably from about 0.5 wt % to about 5 wt % based on the weight of the entire compositions.

(B-4-4) Other Additives

Further, the photosensitive composition may further contain well-known additives such as inorganic fillers and plasticizers for improving the physical properties of the cured film, sensitizing agents capable of improving the ink adhering property of the photosensitive layer surface.

As the plasticizers, e.g., dioctyl phthalate, didodecyl phthalate, triethylene glycol dicaprylate, dimethyl glycol phthalate, tricresyl phosphate, dioctyl adipate, dibutyl sebacate, triacetyl glycerin are exemplified, and when a binder is used, the addition amount of the plasticizer is 10 wt % or less based on the total weight of the compound having an ethylenically unsaturated bond and the binder.

A UV initiator and a thermal crosslinking agent can also be added to the photosensitive layer for reinforcing the effect of heating/exposure after development aiming at improving the film strength (elongation of press life) of the photosensitive layer.

In addition, for improving the adhesion of the photosensitive layer with a support and for increasing the removing property of an unexposed photosensitive layer by development, additives may be added or an intermediate layer may be provided. For example, it is possible to increase adhesion and improve press life by adding or undercoating compounds having relatively strong interaction with a support, e.g., compounds having diazonium structure and phosphonium compounds. On the other hand, it is possible to improve the developing property of a non-image domain and anti-smearing property by adding or undercoating hydrophilic polymers such as polyacrylic acid and polysulfonic acid.

The photosensitive composition according to the present invention is dissolved in various organic solvents and coated on a support. The solvents used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, y-butyrolactone, methyl lactate, ethyl lactate, etc. These solvents may be used alone or may be used as a mixed solvent. The concentration of the solid contents in a coating solution is generally from 2 to 50 wt %.

The coating amount of a photosensitive layer on a support primarily influences the sensitivity of the photosensitive layer, developing property, the strength and press life of an exposed film, therefore, it is preferred to arbitrarily select the coating amount according to purpose. Too small a coating amount results in insufficient press life. While when it is too large, sensitivity decreases, exposure takes long time, and longer time is required for development processing, which is therefore not advantageous. When the photopolymerizable composition according to the present invention is used for a lithographic printing plate for scanning exposure, which is a primary object of the present invention, the coating amount is preferably from about 0.1 g/m$^2$ to about 10 g/m$^2$, more preferably from 0.5 to 5 g/m$^2$ in dry weight.

Support

For providing a lithographic printing plate, which is one primary purpose of the present invention, it is preferred to provide a photosensitive layer on a support having a hydrophilic surface. Conventionally well known hydrophilic supports so far been used for a lithographic printing plate can be used without any limitation.

Supports for use in the present invention are preferably plate-like supports having dimensional stability. For example, paper, paper laminated with plastics (e.g., polyethylene, polypropylene, polystyrene, etc.), a metal plate (e.g., aluminum, zinc, copper, etc.), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper or a plastic film laminated or deposited with the above metals can be exemplified. The surfaces of these supports may be physically or chemically treated by well-known methods for the purpose of providing hydrophilic property or improving strength, if necessary.

Paper, polyester films and aluminum plates are preferably used in the present invention, above all, aluminum plates are particularly preferably used because they are dimensionally stable and comparatively inexpensive, further, they can provide a hydrophilic and strong surfaces by surface treatment according to necessity. A composite sheet comprising a polyethylene terephthalate film having provided thereon an aluminum sheet as disclosed in JP-B-48-18327 is also preferred.

Preferred aluminum plates are pure aluminum plates or alloy plates containing aluminum as a main component and a trace amount of different elements, and plastic films laminated or deposited with aluminum may also be used. Examples of different elements contained in the aluminum alloy include silicon, iron, manganese, copper, magnesium, chromium, zinc, bismuth, nickel, titanium, etc. The content of different elements in the aluminum alloy is at most 10 wt % or less. In the present invention, particularly preferred aluminum is pure aluminum but 100% pure aluminum is difficult to produce from the refining technique, accordingly, an extremely small amount of different elements may be contained. The composition of an aluminum plate for use in the present invention is not specified as described above, and aluminum plates of conventionally well-known and commonly used materials can be used arbitrarily. Aluminum plates for use in the present invention have a thickness of from about 0.1 to about 0.6 mm, preferably from 0.15 to 0.4 mm, and particularly preferably from 0.2 to 0.3 mm.

In the case of a support having a metal surface, in particular, an aluminum surface, it is preferred to perform surface treatment such as surface roughening treatment (graining), immersion treatment in an aqueous solution of sodium silicate, potassium fluorozirconate, phosphate, etc., or anodizing treatment.

Surface roughening treatment of an aluminum plate is performed by various methods, e.g., by a method of mechanical surface roughening treatment, a method of electrochemical surface roughening treatment by dissolution, and a method of chemical treatment of selectively dissolving the surface. Well-known mechanical methods such as a ball abrading method, a brushing method, a blasting method, and a buffing method can be used in the present invention. As the electrochemical surface roughening treatment, a method of applying an alternating or direct electric current to an aluminum plate in an electrolytic solution of hydrochloric acid, nitric acid, etc., can be used. Further, as disclosed in JP-A-54-63902, a method of combining mechanical roughening treatment with electrochemical roughening treatment can also be used. Prior to surface roughening of an aluminum plate, degreasing is performed to remove the rolling oils on the surface of the plate by means of, e.g., surfactants, organic solvents or alkaline aqueous solution, if required.

Further, an aluminum plate subjected to immersion treatment in an aqueous solution of sodium silicate after roughening treatment is preferably used. As disclosed in JP-B-47-5125, an aluminum plate immersion-treated in an aqueous solution of alkali metal silicate after anodizing treatment is preferably used. Anodizing treatment is performed by turning on electricity with an aluminum plate as the anode in an electrolytic solution comprising alone or combination of two or more of an aqueous solution or nonaqueous solution of an inorganic acid, e.g., phosphoric acid, chromic acid, sulfuric acid, boric acid, etc., or an organic acid, e.g., oxalic acid, sulfamic acid, etc., or salts of these acids.

Silicate electrodeposition disclosed in U.S. Pat. No. 3,658,662 is also effective.

Surface treatment of combining the support subjected to electrolytic graining disclosed in JP-B-46-27481, JP-A-52-58602 and JP-A-52-30503 with surface treatment of the above anodizing treatment and sodium silicate treatment is also useful.

Further, the technique disclosed in JP-A-56-28893 comprising the steps of performing mechanical surface roughening, chemical etching, electrolytic graining, anodizing treatment and sodium silicate treatment in order is also preferably used in the present invention.

The support undercoated with water-soluble resins, e.g., polymers and copolymers having a polyvinyl phosphonic acid group, a sulfonic acid group at the side chains, polyacrylic acid, water-soluble metal salts (e.g., zinc borate), a yellow dye, amine salt, etc., after being subjected to the above treatments is also preferably used in the present invention.

A support subjected to sol-gel treatment, by which the support is covalently bonded to a functional group capable of causing addition polymerization by radicals as disclosed in JP-A-7-159983, is also preferably used in the present invention.

As other preferred examples, an arbitrary support having provided thereon a waterproof hydrophilic layer as a surface layer is exemplified. As such surface layers, e.g., a layer comprising an inorganic pigment and a binder disclosed in U.S. Pat. No. 3,055,295 and JP-A-56-13168, a hydrophilic swelling layer disclosed in JP-A-9-80744, and a sol-gel film comprising titanium oxide, polyvinyl alcohol, and silicic acids disclosed in JP-W-A-8-507727 (the term "JP-W-A" as used herein means a "published Japanese national stage of international application") can be exemplified.

Such hydrophilizing treatments are performed not only for hydrophilizing the surface of a support but also for preventing harmful reaction of the photopolymerizable composition provided on a support and for improving the adhesion property of a photosensitive layer.

In the first aspect of the invention, when the photosensitive material using the photopolymerizable composition is used as the image-recording material, an image is obtained in general by image exposure and then removing the unexposed part of the photosensitive layer by a developing solution. When the photopolymerizable composition is used for forming a lithographic printing plate, the developing solutions disclosed in JP-B-57-7427 are preferably used, e.g., aqueous solutions of inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, and aqueous ammonia, and organic alkali agents such as monoethanolamine or diethanolamine are preferably used. These inorganic or organic alkali agents are added so that the concentration of the aqueous solution becomes preferably from 0.1 to 10 wt %, more preferably from 0.5 to 5 wt %.

The alkaline aqueous solution can contain, according to necessity, a surfactant and an organic solvent, e.g., a small amount of benzyl alcohol, 2-phenoxyethanol, or 2-butoxyethanol. For example, the compounds disclosed in U.S. Pat. Nos. 3,375,171 and 3,615,480 can be exemplified.

Further, the developing solutions disclosed in JP-A-50-26601, JP-A-58-54341, JP-B-56-39464 and JP-B-56-42860 are excellent and also preferably used.

In addition, in the plate-making process of a photosensitive image-recording material of the first aspect of the present invention, if necessary, the plate may be heated all over the surface before exposure, during exposure and during the time from exposure to development. The image-forming reaction in the photosensitive layer is accelerated by heating, which leads to the improvement of sensitivity and press life and the stabilization of sensitivity. Further, for the purpose of improving the image strength and press life, it is effective for the image after development to be subjected to whole image post-heating or whole image exposure. Heating before development is generally preferably performed on moderate condition of 150° C. or lower. If the temperature is too high, such a problem that the non-image domain is fogged occurs. Heating after development is performed on very severe condition, i.e., generally from 200 to 500° C. Lower temperature does not result in sufficient image strengthening effect, while higher temperature leads to the degradation of a support and thermal decomposition of an image domain.

As the exposure method of a lithographic printing plate for scanning exposure using the photosensitive image-recording material of the first aspect of the present invention, well-known methods can be used with no limitation. Preferred wavelength of a light source is from 350 nm to 450 nm, specifically an InGan series semiconductor laser is preferably used. Exposure mechanism may be any of an internal drum type, an external drum type, or a flat bed type exposure. By using highly water-soluble photosensitive layer components, they are also soluble in neutral water and weak alkaline water, and a lithographic printing plate having such constitution can take a system of exposure-development on machine after being mounted on a printing machine.

As available laser light sources of from 350 nm to 450 nm, the following lasers can be used.

As gas lasers: Ar ion laser (364 nm, 351 nm, 10 mW to 1 W), Kr ion laser (356 nm, 351 nm, 10 mW to 1 W), and He-Cd laser (441 nm, 325 nm, 1 mW to 100 mW);

As solid state lasers: combination of Nd/YAG (YVO$_4$) and SHG crystals multiplying 2 times (355 nm, 5 mW to 1 W), and combination of Cr/LiSAF and SHG crystals (430 nm, 10 mW);

As semiconductor lasers: KNbO$_3$ ring resonator (430 nm, 30 mW), combination of waveguide type wavelength converting element and AlGaAs, InGaAs semiconductor (380 nm to 450 nm, 5 mW to 100 mW), combination of waveguide type wavelength converting element and AlGaInP, AlGaAs semiconductor (300 nm to 350 nm, 5 mW to 100 mW), and AlGaInN (350 nm to 450 nm, 5 mW to 30 mW); and As other pulse lasers: N$_2$ laser (337 nm, pulse 0.1 to 10 mJ), and XeF (351 nm, pulse 10 to 250 mJ).

Of these, an AlGaInN semiconductor laser (commercially available InGaN series semiconductor lasers, 400 to 410 nm, 5 to 30 mW) is particularly preferred in view of the wavelength characteristics and the cost.

As the exposure apparatuses of lithographic printing plate for scanning exposure system, exposure mechanism may be an internal drum type, an external drum type, or a flat bed type exposure, and those capable of continuous oscillation among the above light sources can be preferably used as the light sources. The following exposure apparatuses are particularly preferred in practice from the relationship between the sensitivity of a photosensitive material and the time of plate-making.

An exposure apparatus of single beam to triple beams using one or more gas laser or solid state laser light sources, so that the total output of the semiconductor laser becomes 20 mW or more by internal drum type.

An exposure apparatus of multi-beams (from 1 to 10 beams) using one or more semiconductor laser, gas laser or solid state laser light sources, so that the total output becomes 20 mW or more by flat bed type.

An exposure apparatus of multi-beams (from 1 to 9 beams) using one or more of a semiconductor laser, gas laser or solid state laser light source, so that the total output becomes 20 mW or more by external drum type.

An exposure apparatus of multi-beams (10 beams or more) using one or more semiconductor laser or solid state laser light sources, so that the total output becomes 20 mW or more by external drum type.

In the above direct imaging lithographic printing plates by laser beams, the following equation (eq 1) in general comes to existence among the sensitivity of a photosensitive material X (J/cm$^2$), the exposure area of the photosensitive material S (cm$^2$), the power of one laser light source q (W), the number of laser beams n, and the total exposure time t (s):

$$X \cdot S = n \cdot q \cdot t \qquad \text{(eq 1)}$$

i) In the Case of Internal Drum Type (Single Beam):

The following equation (eq 2) in general comes to existence among the laser revolution number f (radian/s), the sub-scanning length of a photosensitive material Lx (cm), the resolving power Z (dot/cm), and the total exposure time t (s):

$$f \cdot Z \cdot t = Lx \qquad \text{(eq 2)}$$

ii) In the Case of External Drum Type (Multi-beams):

The following equation (eq 3) in general comes to existence among the drum revolution number F (radian/s), the sub-scanning length of a photosensitive material Lx (cm), the resolving power Z (dot/cm), the total exposure time t (s), and the beam number (n):

$$F \cdot Z \cdot n \cdot t = Lx \qquad \text{(eq 3)}$$

iii) In the Case of Flat Bed Type (Multi-beams):

The following equation (eq 4) in general comes to existence among the polygonal mirror revolution number H (radian/s), the sub-scanning length of a photosensitive material Lx (cm), the resolving power Z (dot/cm), the total exposure time t (s), and the beam number (n):

$$F \cdot Z \cdot n \cdot t = Lx \qquad \text{(eq 4)}$$

By substituting the resolving power required of the practical printing plate (2,560 dpi), the plate size (A1/B1, sub-scanning length 421 inches), the exposure condition of about 20 sheets/hour, and the photosensitive characteristics of the photosensitive composition of the present invention (photosensitive wavelength, sensitivity: about 0.1 mJ/cm$^2$) for the above equation, it can be understood that the combination of the photosensitive material using the photosensitive composition according to the present invention with a multi-beam exposure system using a laser having total output of 20 mW or more is particularly preferred. Further, taking the operational property and the cost into consideration, the combination with external drum type and an exposure apparatus of semiconductor laser multi-beams (10 beams or more) is most preferred.

As other exposure rays for the photopolymerizable composition of the first aspect of the present invention, various kinds of ultra-high pressure, high pressure, intermediate pressure and low pressure mercury lamps, chemical lamps, carbon arc lamps, xenon lamps, metal halide lamps, visible and ultraviolet laser lamps, fluorescent lamps, tungsten lamps and sunlight can be used. Besides the lithographic printing plate for scanning exposure, the photopolymerizable composition according to the present invention can be widely used in the field of photo-curable resins with no particular limitation, e.g., when the photopolymerizable composition is applied to a liquid photopolymerizable composition combined with a cationic polymerizable compound according to necessity, a high speed optical image-forming material can be obtained. Further, the photopolymerizable composition can be used as a material for hologram by making use of the refractive index variation with photopolymerization. The composition can also be applied to a variety of transfer materials (a stripping off photographic material, a toner developing material, etc.) by making use of the surface adhesion variation with photopolymerization. It also can be used in photo-curing of microcapsules. It can further be applied to the manufacture of electronic materials such as photoresist, and the photo-curable resin materials of inks, coatings and adhesives.

In the second aspect of the present invention, the photosensitive layer contains, as essential components, (B-5) a titanocene compound and (B-6) a compound which undergoes a reaction by a radical to change and retain at least either of physical or chemical characteristics thereof, and further, if necessary, (B-7) a binder polymer and (B-8) other components. These components will be specifically described below.

(B-5) Titanocene Compound

The photosensitive layer according to the present invention contains at least one titanocene compound.

Titanocene compounds for use in the photosensitive composition according to the present invention as a photoinitiator are not particularly limited and any compound can be used so long as it can generate active radicals when irradiated with light in the coexistence with the above-described sensitizing dye. For example, well-known compounds disclosed in the following patents can arbitrarily be used: JP-A-59-152396, JP-A-61-151197, JP-A-63-41483, JP-A-63-41484, JP-A-2-249, JP-A-2-291, JP-A-3-27393, JP-A-3-12403 and JP-A-6-41170.

More specifically, dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, and bis(cyclopentadienyl)-bis(2,6-difluoro-3-(pir-1-yl)phenyl)titanium (hereinafter sometimes referred to as "T-1") can be exemplified.

Concerning the titanocene compounds according to the present invention, similarly to the above sensitizing dyes, various chemical modifications can be performed for the purpose of further improving the characteristics of the photosensitive layer. For example, a method of bonding titanocene compounds to sensitizing dyes, addition polymerizable unsaturated compounds and other radical-generating parts, a method of introducing hydrophilic moieties, a method of introducing substituents for the purpose of compatibility improvement and crystal precipitation prevention, a method of introducing substituents for the purpose of adhesion improvement, and a method of polymerization can be used.

Concerning the usage of these titanocene compounds, it can also be selected arbitrarily according to the designs of the performances of photosensitive materials in the same way as the later-described addition polymerizable compounds and the sensitizing dyes described above. For example, the compatibility with a photosensitive layer can be increased by using two or more titanocene compounds in combination. In general, it is preferred to use a large amount of titanocene compounds from the point of photosensitivity. The amount of from 0.5 to 80 weight parts, preferably from 1 to 50 weight parts, per 100 weight parts of the photosensitive layer components is sufficient to obtain satisfactory photosensitivity. On the other hand, when the use of a photosensitive layer under a yellow lamp and a white lamp is taken into consideration, which is a primary object of the present invention, the use amount of titanocene compounds is preferably small from the point of fogging due to light in the vicinity of 500 nm. Even if the amount of titanocene compounds is reduced to 6 weight parts or less, further 1.9 weight parts or less, and still further 1.4 weight parts or less, sufficient photosensitivity can be obtained by the combined use with the sensitizing dye.

(B-6) Compound Which Undergoes Reaction by Radical to Change and Retain at Least Either of Physical or Chemical Characteristics Thereof A compound (B-6) according to the present invention which undergoes a reaction by a radical to change and retain at least either of physical or chemical characteristics thereof is a compound whose physical or chemical characteristics are changed and retained by the function of the active seed generated by the photoreaction of the above-described photoinitiator. Component (B-6) is not particularly limited and any arbitrary compound can be used so long as it has such a property. For example, the above-exemplified compounds as initiators per se have such a property in many cases. The characteristics of component (B-6) which are changed by the function of a radical generated from a photoinitiator include physical characteristics of the molecule such as absorption spectrum (color), chemical structure and polarizability, and physical characteristics of the material such as solubility, strength, refractive index, flowing property, and adhesive property.

For example, when a compound the absorption spectrum of which changes by an oxidation reaction, a reduction reaction or a nucleophilic addition reaction is used as component (B-6), an image can be formed as a result of the oxidation or reduction caused by a radical generated from a photoinitiator. Such examples are described, e.g., in *J. Am.*

*Chem. Soc.*, 108, 128 (1986), *J. Imaging Sci.*, 30, 215 (1986) and *Israel J. Chem.*, 25 264 (1986).

Further, by combining an addition polymerizable compound or a compound capable of polycondensation, as component (B-6), with a photoinitiator, it is possible to form a photo-curable resin or a negative photopolymer.

As component (B-6), a radical polymerizable compound (e.g., a compound having an ethylenically unsaturated bond), a cationic polymerizable compound (e.g., an epoxy compound, a vinyl ether compound, a methylol compound), and an anionic polymerizable compound (e.g., an epoxy compound) are used, and examples of these compounds are described, e.g., in, compiled by the Photopolymer Meeting, *Photopolymer Handbook,* Kogyo Chosa-Kai (1989), and *Kobunshi* (*Polymer Compounds*), 45, 786 (1996). Compositions comprising thiol compounds as component (B-6) and photo-radical generators in combination are also well known.

Component (B-6), which is an addition polymerizable compound and an excellent component for one object of the present invention of providing a high speed lithographic printing plate will be described in detail below.

An addition polymerizable compound having at least one ethylenically unsaturated double bond which is preferably used in the present invention as component (B-6) is selected from among the compounds having at least one, preferably two or more, ethylenically unsaturated bond(s) at terminals. Such compounds are well known in the industry and they can be used in the present invention with no particular limitation. Such compounds have the chemical form of, e.g., a monomer, a prepolymer, i.e., a dimer, a trimer, and an oligomer or a mixture and a copolymer of them.

As examples of monomers and copolymers thereof, unsaturated carboxylic acids (e.g., acrylic acid, methacrylic acid, itaconic acid, crotonic acid, isocrotonic acid, maleic acid, etc.), and esters and amides thereof can be exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of unsaturated carboxylic esters and amides having a nucleophilic substituent such as a hydroxyl group, an amino group and a mercapto group with monofunctional or polyfunctional isocyanates and epoxies, and the dehydration condensation reaction products of these compounds with monofunctional or polyfunctional carboxylic acids are also preferably used. The addition reaction products of unsaturated carboxylic esters and amides having electrophilic substituents such as an isocyanato group and an epoxy group with monofunctional or polyfunctional alcohols, amines and thiols, and the substitution reaction products of unsaturated carboxylic esters and amides having separable substituents such as a halogen group and a tosyloxy group with monofunctional or polyfunctional alcohols, amines and thiols are also preferably used. As another example, it is also possible to use compounds in which the above unsaturated carboxylic acids are replaced with unsaturated phosphonic acid, styrene, vinyl ether, etc.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, etc.

As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane, etc.

As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

As crotonates, examples include ethylene glycol dicrotonate, tetramethylene glycol dicrotonate, pentaerythritol dicrotonate, sorbitol tetradicrotonate, etc.

As isocrotonates, examples include ethylene glycol diisocrotonate, pentaerythritol diisocrotonate, sorbitol tetraisocrotonate, etc.

As maleates, examples include ethylene glycol dimaleate, triethylene glycol dimaleate, pentaerythritol dimaleate, sorbitol tetramaleate, etc.

As examples of other esters, e.g., aliphatic alcohol esters disclosed in JP-B-46-27926, JP-B-51-47334 and JP-A-57-196231, esters having an aromatic skeleton disclosed in JP-A-59-5240, JP-A-59-5241 and JP-A-2-226149, and esters having an amino group disclosed in JP-A-1-165613 can also be preferably used in the present invention.

Further, the mixtures of the above-described ester monomers can also be used.

Further, specific examples of amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc.

As other preferred amide monomers, those having cyclohexylene structure disclosed in JP-B-54-21726 can be exemplified.

Further, urethane-based addition polymerizable compounds which are obtained by the addition reaction of an isocyanate and a hydroxyl group are also preferably used in the present invention, and as the specific example, as is disclosed in JP-B-48-41708, a vinyl urethane compound having two or more polymerizable vinyl groups in one molecule can be exemplified, which is obtained by the addition of a vinyl monomer having a hydroxyl group represented by the following formula (V) to a polyisocyanate compound having two or more isocyanate groups in one molecule.

$$CH_2=C(R)COOCH_2CH(R')OH \qquad (V)$$

wherein R and R' each independently represents H or $CH_3$.

Further, urethane acrylates as disclosed in JP-A-51-37193, JP-B-2-32293 and JP-B-2-16765, and urethane compounds having an ethylene oxide skeleton as disclosed in JP-B-58-49860, JP-B-56-17654, JP-B-62-39417, and JP-B-62-39418 are also preferably used in the present invention.

Moreover, extremely high speed photopolymerizable compositions can be obtained by using addition polymerizable compounds having amino structure and sulfide structure in the molecule as disclosed in JP-A-63-277653, JP-A-63-260909 and JP-A-1-105238.

As other examples of component (B-2), polyfunctional acrylates and methacrylates, such as polyester acrylates, and epoxy acrylates obtained by reacting epoxy resins with (meth)acrylic acids as disclosed in JP-A-48-64183, JP-B-49-43191 and JP-B-52-30490 can be exemplified. Furthermore, specific unsaturated compounds as disclosed in JP-B-46-43946, JP-B-1-40337, and JP-B-1-40336, and vinyl sulfonic acid compounds as disclosed in JP-A-2-25493 can also be exemplified. Further, according to cases, structures containing a perfluoroalkyl group as disclosed in JP-A-61-22048 are preferably used. Moreover, photocurable monomers and oligomers introduced into *Bulletin of Nihon Setchaku Kyokai,* Vol. 20, No. 7, pp. 300 to 308 (1984) can be used as well.

The details of the usage of the addition polymerizable compound, e.g., what structure is to be used, whether the compound is to be used alone or in combination, and what an amount is to be used, can be optionally set up according to the final design of the characteristics of the photosensitive material. For example, the conditions are selected from the following viewpoint. From the point of a photosensitive speed, the structure containing many unsaturated groups per molecule is preferred, and in many cases bifunctional or more functional groups are preferred. For increasing the strength of an image domain, i.e., a cured film, trifunctional or more functional groups are preferred, further, it is also effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength on one hand, they are in some cases not preferred in the point of development speed and the precipitation in a developing solution on the other hand. The selection and usage of the addition polymerizable compound are important factors for the compatibility with other components (e.g., a binder polymer, an initiator, a colorant, etc.) in the photosensitive layer and dispersibility, for example, sometimes compatibility can be improved by using a low purity compound or two or more compounds in combination. Further, it is also possible to select a compound having specific structure for the purpose of improving the adhesion property of a support and an overcoat layer.

Concerning the compounding ratio of the addition polymerizable compound in the photosensitive layer, the more the amount, the higher is the sensitivity, but too large an amount sometimes results in disadvantageous phase separation, problems in manufacturing process due to the stickiness of the photosensitive layer (e.g., manufacturing failure resulting from the transfer and adhesion of the photosensitive material components), and precipitation from a developing solution. From these points of view, a preferred compounding ratio of the addition polymerizable compound is in many cases from 5 to 80 wt %, preferably from 25 to 75 wt %, based on the entire composition components. The addition polymerizable compound may be used alone or in combination of two or more. In addition, appropriate structure, compounding ratio and addition amount of the addition polymerizable compound can be arbitrarily selected taking into consideration the degree of polymerization hindrance due to oxygen, resolution, fogging property, refractive index variation and surface adhesion. Further, the layer constitution and the coating method of undercoating and overcoating can be performed according to circumstances.

(B-7) Binder Polymer, (B-8) Other Components

Disclosure regarding (B-7) and (B-8) correspond to the disclosure regarding (B-3) and (B-4) of the first aspect of the present invention, respectively.

It is preferred to handle the photosensitive image-recording material according to the second aspect of the present invention under a safelight cutting off the rays of 500 nm or less, by which the problem of light fog is further solved and handleability under a safelight becomes better. Such a safelight can be obtained by using a filter cutting short wavelength rays over general fluorescent lamps but when high speed photosensitive image-recording materials are handled as in the present invention, it is necessary to select filters capable of sufficiently cutting short wavelength rays off. In addition, it is also effective to use light sources, not fluorescent lamps having emission spectra in ordinary wide ranges, not themselves having emission spectrum in the wavelength of 500 nm or less, or having weak emission intensity. For instance, electric discharge lamps containing sodium as a main component and emitting yellow D ray of 589 nm are particularly preferred since they have a monochromatic emission spectrum in high region of spectral luminous efficiency of human being.

(C) Colored Layer

In the first aspect of the present invention, a colored layer can be provided by uniformly coating a colorant on the photosensitive layer and under the oxygen-cutoff layer or on the oxygen-cutoff layer. For the dispersion of a colorant, an aqueous or oily solvent or a water-soluble or oil-soluble (co)polymer can be used. Any dispersant can be used as the dispersant of a colorant but it is preferred to use those not compatible with the photosensitive layer. That is, when a colored layer is directly provided on the lipophilic photosensitive layer, it is preferred to provide a hydrophilic colored layer. The harmful influence such as desensitization due to entering of a colorant into the photosensitive layer can be avoided by this constitution. As the water-soluble (co) polymers, the same material as used in the oxygen-cutoff layer can be used. Further, it is particularly preferred to select a dispersant which can be development processed by an aqueous developing solution such as aqueous alkali.

Dyes or pigments can be used as the colorant to be added to the colored layer and it is particularly preferred to use the following water-soluble dyes alone or in combination.

As the water-soluble dyes, e.g., cationic dyes, reactive dyes, acidic dyes and direct dyes can be exemplified. Specifically, nitroso dyes, e.g., Naphthol Green B; nitro dyes, e.g., Naphthol Yellow S and Polar Yellow Brown; azo dyes, e.g., Diachrone Scarlet RN, Diamirror Red B, Diamira Brilliant Red BB, Diamira Brilliant Violet 5R, Diamira Brilliant Red GG, Diamira Brilliant Orange FR, Diamira Brilliant Orange 3R, Diacryl Brilliant Red GTL-N, Diacryl Red GL-N, Diacryl Brilliant Red GRL-N, Victoria Scarlet 3R, Sulfone Acid Blue R, Supramine Red GG, Supramine Red B, Supramine Blue R, Polar Red G, Polar Orange R, Metachrome Red 5G, Metachrome Brilliant Blue BL, Supranol Orange RR and Supranol Brilliant Red; thiazole dyes, e.g., Diacryl Red CS-N, Thiazine Red R, Sirius Scarlet B and Thioflavine T; diphenylmethane dyes, e.g., Auramine; triphenylmethane dyes, e.g., Victoria Pure Blue BOH, Crystal Violet, Methyl Violet, Ethyl Violet, Spirit Blue, Acid Violet 6B and Malachite Green; xanthene dyes, e.g., Pyronine G, Rhodamine S, Eosine G, Eosine Y, Erythrocin, Rose Bengale B, Rhodamine B and Rhodamine 3GO; acridine dyes, e.g., Acridine Orange 2G and Euchrysine 2GNX; azine dyes, e.g., Neutral Violet, Neutral Red, Azocarmine G, Safranine T, Wool Fast Blue BL and Indocyanine B; oxazine dyes, e.g., Meldola's Blue, Nile Blue A and Gallocyanine; dioxazine dyes, e.g., Sirius Light Blue FFRL and Sirius Light Blue F3GL; thiazine dyes e.g., Methylene Blue and Methylene Green B; anthraquinone dyes, e.g. Diacid Light Blue BR, Alizarine Direct Violet EFF, Supracen Violet 4BF, Alizarine Sky Blue B, Alizarine Cyanine Green G, Carbolan Green G, Alizarine Saphirol B, Alizarine Cyanine Green 5G, Alizarine Brilliant Pure Blue R, Alizarine Brilliant Light Red 4B and Alizarine Uranol 2B; phthalocyanine dyes, e.g., Heliogen Blue SBP and Drazole Fast Blue 8GS; cyanine dyes, e.g., Diacryl Brilliant Red 3GN, Diacryl Brilliant Pink GN, Diacryl Brilliant Pink RN and Diacryl Brilliant Red 6BN; and quinoline dyes, e.g., Quinoline Yellow and Supra Light Yellow GGL can be used in the present invention.

These dyes are all soluble in the solvents and/or (co) polymers constituting the main component(s) of the colored layer composition, and they can be selected according to various purposes but they must be the dyes having the main absorption spectrum in the wavelength region other than the emission spectrum of the light source necessary to form an image on a photosensitive lithographic printing plate. Further, it is necessary that the absorbance of the colored layer in the wavelength region of the emission spectrum should be 0.5 or less, preferably 0.1 or less.

If these conditions are not satisfied, inconvenience such as sensitivity reduction is caused. For example, in the case of a photosensitive lithographic printing plate for use for scanning exposing an image by an argon UV laser, it is proper to add a dye having a maximum absorption wavelength in 420 nm or more to a colored layer since the lights of the wavelengths of 357 nm and 364 nm are used for forming an image. As other example, in the case of forming an image by a high pressure mercury lamp, a metal halide lamp or a helium-cadmium laser, it is preferred to use a dye having a maximum absorption wavelength in 500 nm or more since UV rays of near 440 nm or less are used, and when an image is formed by an argon visible laser, as the lights of the wavelengths of 488 nm and 515 nm are used, dyes having absorption spectra other than these wavelengths can be contained in a colored layer.

It is also a large characteristic of the present invention that the above water-soluble dyes can be selected for the purpose of improving safelight aptitude of the photosensitive lithographic printing plate of the present invention. For example, the emission spectrum of yellow fluorescent lamps generally used as the safelight for photosensitive materials is 500 nm or more, hence photosensitive lithographic printing plates having photosensitive wavelength region in 500 nm or less are thought to be capable of being handled with no problem under a yellow fluorescent lamp. However, strictly speaking, since the emission spectrum of a yellow fluorescent lamp is observed to the vicinity of 470 nm, a yellow fluorescent lamp has photosensitive wavelength end to the vicinity of 470 nm, and moreover a high speed photosensitive lithographic printing plate is sensitized by a yellow fluorescent lamp to cause an inconvenience of so-called light fog. Changing the sensitizing dye in photosensitive compositions affects other various performances of the photosensitive material so it is not easy. However, the above problem can be easily solved according to the present invention without changing any of the photosensitive composition by providing a colored layer colored by a water-soluble dye having the absorption spectrum to the vicinity of 470 nm similar to the emission spectrum of a yellow fluorescent lamp on the photosensitive layer. Further, when a colored dye containing a water-soluble dye having the absorption spectrum of short wavelength end in the vicinity of 400 nm is used, it becomes possible to produce a photosensitive lithographic printing plate capable of being handled under a so-called UV cut white fluorescent lamp not emitting UV rays lower than near 400 nm. In such a case, the operation environment can be further improved.

The above water-soluble dyes selected under these conditions can be added in an amount of generally from 0.1 to 20 wt % based on the solvent or the aqueous solution of the (co)polymer constituting the main component of the colored layer composition, but the optimal amount is such an amount that the colored layer coated on the surface of the colored photosensitive composition layer has sufficient visibility, i.e., such an amount that the optical reflection density of the colored layer surface of the photopolymerizable photosensitive lithographic printing plate becomes preferably from 0.5 to 3.0, more preferably from 0.8 to 1.5. However, the reflection density varies largely depending upon the concentration and the hue of the colorant in a photosensitive composition. That is, when a water-soluble dye for coloring the colored layer and the colorant in a photosensitive composition are in the relationship of complementary colors, the optical density of the surface of the photosensitive lithographic printing plate becomes synergistically high, therefore, a relatively small amount of dye is sufficient to be added to the colored layer. Accordingly, since the film condition of the colored layer coated on the surface of the photosensitive composition layer is sufficiently confirmable when the optical density of a simple colored layer is from 0.05 to 1.0, the more preferred addition amount of the water-soluble dye required for coloring the colored layer is from 0.5 to 10 wt % based on the aqueous solution of the (co)polymer of the colored layer composition.

EXAMPLE

The present invention will be described in detail below with referring to examples but it should not be construed as the present invention is limited thereto.

Examples 1 to 8 and Comparative Examples 1 to 3
Preparation of Support

An aluminum plate having a thickness of 0.3 mm was immersed in a 10 wt % aqueous sodium hydroxide solution at 60° C. for 25 seconds to effect etching, then washed with flowing water, washed with a 20 wt % aqueous nitric acid solution for neutralization and then washed with water. The plate was subjected to electrolytic surface roughening treatment in a 1 wt % aqueous nitric acid solution with applying alternating waveform electric current of sine wave at anode current of 300 coulomb/dm$^2$. Subsequently, the plate was immersed in a 1 wt % aqueous sodium hydroxide solution at 40° C. for 5 seconds, then immersed in a 30 wt % aqueous sulfuric acid solution and desmutting-treated at 60° C. for 40 seconds. Thereafter, the plate was subjected to anodization treatment for 2 minutes in a 20 wt % aqueous sulfuric acid solution at the electric density of 2 A/dm$^2$ so that the thickness of the anodic oxidation film reached 2.7 g/m$^2$. On measurement, the surface roughness was 0.3 pm (Ra indication by JIS B0601).

The sol-gel reaction solution shown below was coated on the back surface of the thus-treated plate by means of a bar coater, and the coated plate was dried at 100° C. for 1 minute, thereby a support having a back coat layer having a dry coating amount of 70 mg/m² was prepared.

| Sol-Gel Reaction Solution | |
|---|---|
| Tetraethyl silicate | 50 weight parts |
| Water | 20 weight parts |
| Methanol | 15 weight parts |
| Phosphoric acid | 0.05 weight parts |

When the above component was mixed and stirred, heat generation started after about 5 minutes. After the reaction was continued for 60 minutes, the following solution was added to the reaction solution, to thereby prepare a back coat layer coating solution.

| | |
|---|---|
| Pyrogallol-formaldehyde condensation resin (molecular weight: 2,000) | 4 weight parts |
| Dimethyl phthalate | 5 weight parts |
| Fluorine-containing surfactant (N-butylperfluorooctanesulfonamide ethyl acrylate/polyoxyethylene acrylate copolymer, molecular weight: 20,000) | 0.7 weight parts |
| Methanol Silica Sol (manufactured by Nissan Chemical Industries, Ltd., methanol: 30 wt %) | 50 weight parts |
| Methanol | 800 weight parts |

Preparation of Photosensitive Layer

The following photopolymerizable composition was coated on the thus-treated aluminum plate in a dry coating weight of 1.0 g/m², and the coated plate was dried at 80° C. for 2 minutes, thus a photosensitive layer was formed.

| Photopolymerizable Composition | |
|---|---|
| Pentaerythritol tetraacrylate | 1.5 g |
| Allylmethacrylate/methacrylic acid copolymer (copolymerization molar ratio: 83/17) | 2.0 g |
| Photopolymerization initiator (shown in Table 1) | |
| Sensitizing dye (shown in Table 1) | |
| Titanocene compound (T-2) | 0.3 g |
| Co-sensitizer (shown in Table 1) | |
| Fluorine-based nonionic surfactant (F-177P) | 0.02 g |
| Thermal polymerization inhibitor, (N-nitrosophenylhydroxyl) | 0.01 g |
| Pigment dispersion | 2.0 g |
| Composition of pigment dispersion | |
| Pigment Blue (15/6) | 15 weight parts |
| Allylmethacrylate/methacrylic acid copolymer (copolymerization molar ratio: 83/17) | 10 weight parts |
| Cyclohexanone | 15 weight parts |
| Methoxypropyl acetate | 20 weight parts |
| Propylene glycol monomethyl ether | 40 weight parts |
| Methyl ethyl ketone | 20.0 g |
| Propylene glycol monomethyl ether | 20.0 g |

Preparation of Protective Layer for Comparative Example 1

A 3 wt % aqueous solution of polyvinyl alcohol (saponification degree: 98 mol %, polymerization degree: 550) was coated on the above-prepared photosensitive layer in a dry coating weight of 2 g/m², and dried at 100° C. for 2 minutes.

Preparation of Protective Layer for Comparative Example 2

An aqueous solution containing 3 wt % of polyvinyl alcohol (saponification degree: 98 mol %, polymerization degree: 550) and 4 wt % water-soluble dye represented by the following formula (I) was coated on the above-prepared photosensitive layer in a dry coating weight of 2 g/m², and dried at 100° C. for 2 minutes.

Compound Represented by Formula (I)

Compound representd by formula (I)

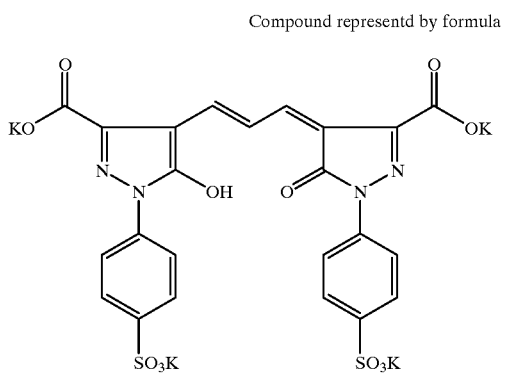

Preparation of Protective Layer for Comparative Example 3

An aqueous solution containing 3 wt % of polyvinyl alcohol (saponification degree: 98 mol %, polymerization degree: 550) and 16 wt % water-soluble dye represented by the above formula (I) was coated on the above-prepared photosensitive layer in a dry coating weight of 3 g/m², and dried at 100° C. for 3 minutes.

Preparation of Colored Layers for Examples 1 to 8

A protective layer was provided on each photosensitive layer in the same manner as in Comparative Example 1, and an aqueous solution containing 3 wt % of polyvinyl alcohol (saponification degree: 98 mol %, polymerization degree: 550) and 24 wt % water-soluble dye represented by the above formula (I) was coated on the above-prepared protective layer in a dry coating weight of 2 g/m², and the coated layer was dried at 100° C. for 2 minutes.

Evaluation of Photosensitivity and Safelight Aptitude

Fuji Step Guide (manufactured by Fuji Photo Film Co., Ltd., a gray scale showing discontinuous variation of transmitted optical density at ΔD=0.15) was closely contacted on each of the above-obtained photosensitive materials, and exposure was performed using a xenon lamp through an optical filter (Kenko-BP-40) so as to reach the already known exposure energy. For the purpose of estimating the exposure aptitude to the short wavelength semiconductor laser, Kenko-BP-40 capable of exposure with a monochromatic light of 400 nm was used as the optical filter. Thereafter, the photosensitive material sample was subjected to development by immersing in the developing solution having the following composition at 25° C. for 30 seconds. Sensitivity (clear sensitivity) was computed from the highest stage where the image was completely removed (shown in Table 1). "Clear sensitivity" is the lowest necessary energy for the formation of an image, and the lower the value, the higher is the sensitivity.

Further, a printing plate sample produced from each photosensitive lithographic printing plate sample allowed to stand under 100 lx of yellow fluorescent lamp was mounted on a printing machine and whether the non-image area was smeared with the printing ink or not was examined to investigate the allowable time capable of being left standing under a yellow lamp, i.e., the so-called safelight aptitude. The results of the investigation are shown in Table 1 below.

Composition of Developing Solution

An aqueous solution comprising the following composition and having pH 13.

| | |
|---|---|
| 1 K Potassium silicate | 3.0 weight parts |
| Potassium hydroxide | 1.5 weight parts |
| Compound represented by the following formula (II) (Pellex NBL, manufactured by Kao Atlas Co., Ltd.) | 0.2 weight parts |
| Water | 95.3 weight parts |

Compound Represented by Formula (II)

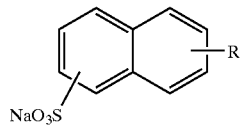

wherein R represents H or $C_4H_9$.

TABLE 1

| Example No. | Sensitizing Dye (addition amount: g) | Co-sensitizer (addition amount: g) | Clear Sensitivity (mJ/cm$^2$) | Yellow Lamp Safety (allowable time, minute) |
|---|---|---|---|---|
| Example 1 | D3 (0.1) | H1 (0.2) | 0.09 | 120 |
| Example 2 | D4 (0.06) | H2 (0.2) | 0.04 | 120 |
| Example 3 | D6 (0.05) | None | 0.11 | 120 |
| Example 4 | D11 (0.08) | H1 (0.5) | 0.06 | 120 |
| Example 5 | D13 (0.08) | None | 0.07 | 120 |
| Example 6 | D1 (0.2) | H4 (0.3) | 0.1 | 120 |
| Example 7 | D14 (0.05) | None | 0.12 | 120 |
| Example 8 | D15 (0.07) | None | 0.06 | 120 |
| Comparative Example 1 | D4 (0.06) | H2 (0.2) | 0.04 | 1 |
| Comparative Example 2 | D4 (0.06) | H2 (0.2) | 0.3 | 20 |
| Comparative Example 3 | D4 (0.06) | H2 (0.2) | 1.0 | 120 |

It was confirmed that the samples according to the present invention were higher speed as compared with the samples whose protective layers were colored and the concentration of colorants could be increased without reducing the oxygen cutoff property to the photosensitive layer, therefore, the photosensitive wavelength region could be controlled without varying the photosensitive composition at all and without reducing sensitivity and further the safelight aptitude could be improved.

As can be seen from the results in Table 1, the lithographic printing plate according to the present invention is very high speed and shows sufficient sensitivity in scanning exposure system.

Examples 9 to 15 and Comparative Examples 4 to 6

Each lithographic printing plate was prepared according to the following procedure and printing performance was evaluated. The results obtained are shown in Table 2 below.

Pre-treatment of Support

A 1S aluminum plate having a thickness of 0.3 mm was subjected to brush-graining treatment using a No. 8 nylon brush and a suspension of 800 mesh pumice powder and water, and the surface of the plate was thoroughly washed with water. The etching was effected by immersing the plate in a 10 wt % sodium hydroxide aqueous solution at 70° C. for 60 seconds, the plate was further washed with flowing water, then washed with a 20 wt % nitric acid aqueous solution for neutralization, followed by washing with water. Under the condition of VA of 12.7 V, the plate was subjected to electrolytic surface roughening treatment in a 1 wt % aqueous nitric acid solution with applying alternating waveform electric current of sine wave at anode current of 300 coulomb/dm$^2$. The surface roughness determined was 0.45 mm (Ra indication by JIS B0601).

Hydrophilizing Treatment of Support Surface

The above support was immersed in a 2.5 wt % aqueous solution of No. 3 sodium silicate ($SiO_2$: 28 to 30%, $Na_2O$: 9 to 10%, Fe: 0.02% or less) having pH of 11.2 at 70° C. for 13 seconds, followed by washing with water. The amount of silicate on the surface obtained from the Si element on the surface measured by fluorescent X-ray analysis was 10 mg/M$^2$.

Coating of Intermediate Layer

The coating solution A of the intermediate layer having the composition shown below was prepared and coated on the hydrophilized surface of the above support by a wheeler at rotation rate of 180 rpm in a coating weight of phenylphosphonic acid of 20 mg/m$^2$, and the coated support was then dried at 80° C. for 30 seconds.

Intermediate Layer Coating Solution A

| | |
|---|---|
| Phenylphosphonic acid | 0.07 g to 1.4 g |
| Methanol | 200 g |

Coating of Photosensitive Layer

The photosensitive layer coating solution having the following composition was prepared and coated on the above support having the intermediate layer by a wheeler in a coating weight of from 1.0 to 2.0 g/m$^2$, and the coated photosensitive layer was dried at 100° C. for 1 minute.

| Photosensitive Layer Coating Solution | |
|---|---|
| Addition polymerization compound (compound shown in Table 2) | 1.5 g |
| Binder polymer (compound shown in Table 2) | 2.0 g |
| Sensitizing dye (compound shown in Table 2) | 0.1 g |
| Activator (T-2) | 0.3 g |
| Co-sensitizer (compound shown in Table 2) | 0.3 g |
| Pigment dispersion | 2.0 g |
| Composition of pigment dispersion | |
| Pigment Blue (15/6) | 15 weight parts |
| Allylmethacrylate/methacrylic acid copolymer (copolymerization molar ratio: 83/17) (thermal polymerization) | 10 weight parts |
| Cyclohexanone | 15 weight parts |
| Methoxypropyl acetate | 20 weight parts |
| Propylene glycol monomethyl ether | 40 weight parts |
| Thermal polymerization inhibitor (N-nitrosophenylhydroxylamine aluminum salt) | 0.01 g |
| Surfactant (Megafac F-177, (manufactured by Dainippon Chemicals & Ink Co., Ltd.) | 0.02 g |
| Methyl ethyl ketone | 20.0 g |
| Propylene glycol monomethyl ether | 20.0 g |

Coating of Protective Layer for Comparative Example 4

A 3 wt % aqueous solution of polyvinyl alcohol (saponification degree: 98 mol %, polymerization degree:

550) was coated on the above-prepared photosensitive layer in a dry coating weight of 2 g/m², and the coated protective layer was dried at 100° C. for 2 minutes.

Coating of Protective Layer for Comparative Example 5

A photosensitive lithographic printing plate was prepared in the same manner as in Comparative Example 4 except that 0.2 g of Rhodamine B was added to the photosensitive solution in Comparative Example 4.

Coating of Protective Layer for Comparative Example 6

An aqueous solution containing 3 wt % of polyvinyl alcohol (saponification degree: 98 mol %, polymerization degree: 550) and 16 wt % Rhodamine B was coated on the above-prepared photosensitive layer in a dry coating weight of 3 g/m², and the coated protective layer was dried at 100° C. for 3 minutes.

Coating of Colored Layers for Examples 9 to 15

An aqueous solution containing 3 wt % of polyvinyl alcohol (saponification degree: 98 mol %, polymerization degree: 550) and 24 wt % Rhodamine B was coated on the above photosensitive layer in a dry coating weight of 2 g/m², and the coated layer was dried at 100° C. for 2 minutes. Further, a 3 wt % aqueous solution of polyvinyl alcohol (saponification degree: 98 mol %, polymerization degree: 550) was coated thereon in a dry coating weight of 2 g/m², and the coated layer was dried at 100° C. for 2 minutes.

Evaluation of Photosensitivity and Safelight Aptitude

Each of the above-obtained samples was subjected to exposure and development in the same manner as in Examples 1 to 8 and Comparative Examples 1 to 3, and sensitivity (clear sensitivity) was computed. Further, the allowable time capable of being left standing under a yellow fluorescent lamp of 100 lx, i.e., the so-called safelight aptitude, was investigated in the same manner as in Comparative Examples 1 to 3. The results obtained are shown in Table 2 below.

Actual acid value obtained by NaOH titration: 1.15 meq/g, Weight average molecular weight obtained by GPC measurement: 130,000

B-2:

Allylmethacrylate/methacrylic acid copolymer (copolymerization molar ratio: 83/17)

Actual acid value obtained by NaOH titration: 1.55 meq/g, Weight average molecular weight obtained by GPC measurement: 125,000

B-3:

Polyurethane resin of the condensation polymerization product of the following diisocyanates and diol:

4,4'-Diphenylmethanediisocyanate (MDI)

Hexamethylenediisocyanate (HMDI)

Polypropylene glycol (PPG1000, weight average molecular weight: 1,000)

2,2-Bis(hydroxymethyl)propionic acid (DMPA)

(copolymerization molar ratio (MDI/HMDI/PPG1000/DMPA): 40/10/15/35, actual acid value obtained by NaOH titration: 1.05 meq/g, weight average molecular weight obtained by GPC measurement: 45,000)

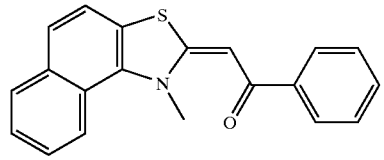

(D1)

TABLE 2

| Example No. | Addition Polymerizable Composition | Binder Polymer | Sensitizing Dye | Co-sensitizer | Developing Solution | Clear Sensitivity (mJ/cm²) | Yellow Lamp Safety (allowable time, minute) |
|---|---|---|---|---|---|---|---|
| Example 9 | M-1 | B-1 | D2 | H2 | DV-1 | 0.14 | 120 |
| Example 10 | M-2 | B-1 | D5 | H4 | DV-2 | 0.07 | 120 |
| Example 11 | M-2 | B-3 | D9 | H5 | DV-3 | 0.07 | 120 |
| Example 12 | M-1 | B-2 | D8 | None | DV-1 | 0.10 | 120 |
| Example 13 | M-1 | B-1 | D7 | H5 | DV-1 | 0.09 | 120 |
| Example 14 | M-2 | B-3 | D10 | H3 | DV-3 | 0.11 | 120 |
| Example 15 | M-2 | B-1 | D12 | H1 | DV-3 | 0.11 | 120 |
| Comparative Example 4 | M-2 | B-3 | D9 | H5 | DV-3 | 0.07 | 1 |
| Comparative Example 5 | M-2 | B-3 | D9 | H5 | DV-3 | 2.5 | 10 |
| Comparative Example 6 | M-2 | B-3 | D9 | H5 | DV-3 | 1.2 | 120 |

Addition Polymerizable Compound in Table 2

M-1:

Pentaerythritol tetraacrylate (manufactured by Shin Nakamura Kagaku Kogyo Co., Ltd., NK ester A-TMMT)

M-2:

Glycerin dimethacrylate hexamethylenediisocyanate urethane prepolymer (manufactured by Kyoeisha Kagaku Co., Ltd., UA101H)

Binder Polymer in Table 2

B-1:

Allylmethacrylate/methacrylic acid/N-isopropylacrylamide copolymer (copolymerization molar ratio: 67/13/20), -continued

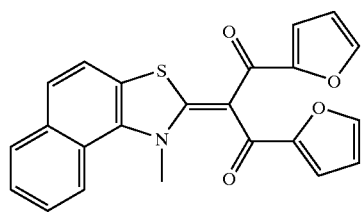

(D2)

-continued
(D3) 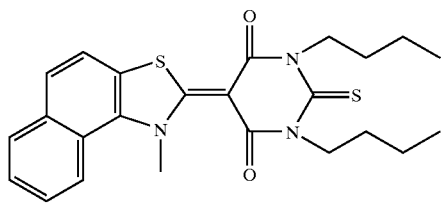
(D4) 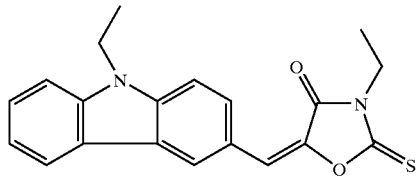
(D5) 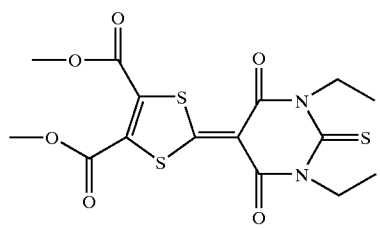
(D6) 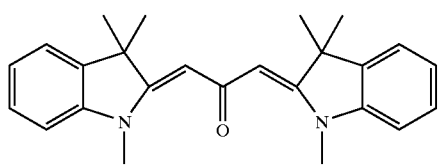
(D7) 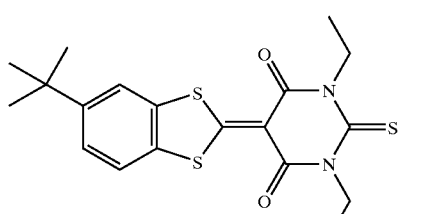
(D8) 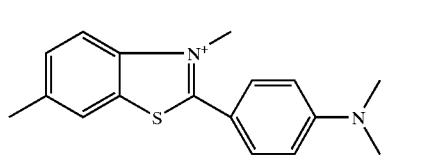
(D9) 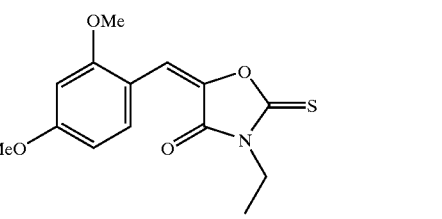
(D10) 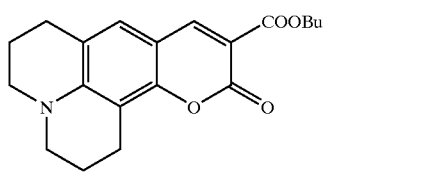
-continued
(D11) 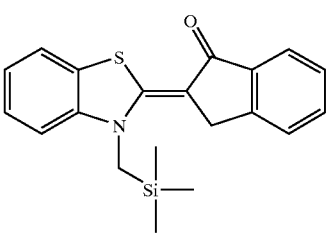
(D12) 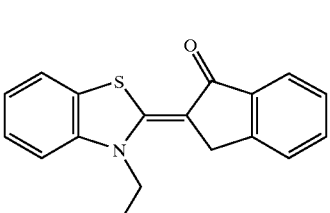
(D13) 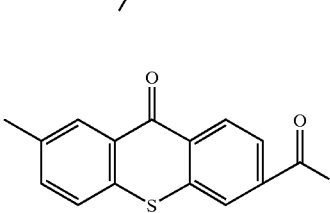
(D14) 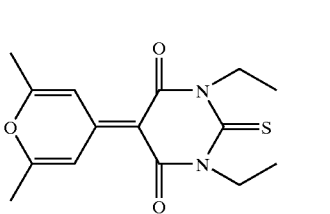
(D15) 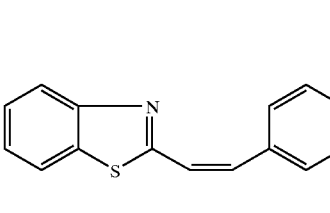
(H1) 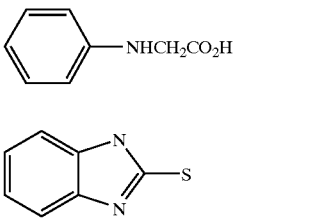
(H2) 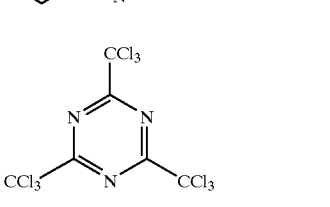
(H3) 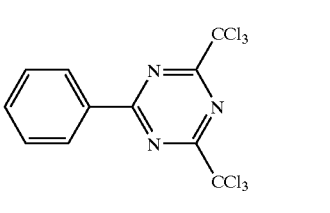
(H4) 

(H5) 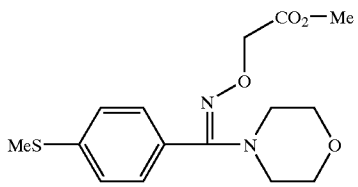

(T-1) 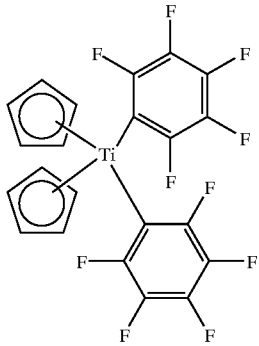

(T-2) 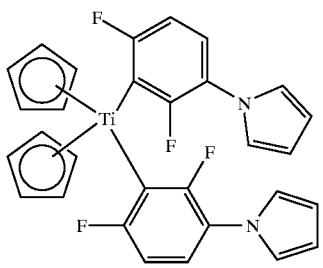

Developing Solution in Table 2

DV-1
An aqueous solution comprising the following composition and having pH 10.

| | |
|---|---|
| Monoethanolamine | 0.1 weight parts |
| Triethanolamine | 1.5 weight parts |
| Compound represented by the following formula 1 (in the formula R represents H or $C_4H_9$) ((Pellex NBL, manufactured by Kao Atlas Co., Ltd.) | 4.0 weight parts |
| Compound represented by the following formula 2 (Nyucole, manufactured by Nihon Nyukazai Co., Ltd.) | 2.5 weight parts |
| Compound represented by the following formula 3 | 0.2 weight parts |
| Water | 91.7 weight parts |

Formula 1

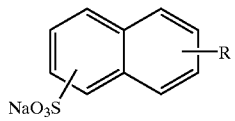

Formula 2

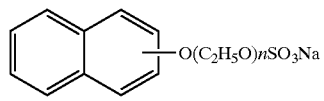

Formula 3

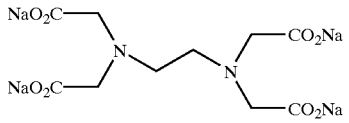

DV-2
An aqueous solution comprising the following composition and having pH 10.

| | |
|---|---|
| Sodium bicarbonate | 1.2 weight parts |
| Sodium carbonate | 0.8 weight parts |
| Compound represented by the above formula 1 | 3.0 weight parts |
| Compound represented by the above formula 2 | 2.0 weight parts |
| Compound represented by the above formula 3 | 0.2 weight parts |
| Water | 92.8 weight parts |

DV-3
An aqueous solution comprising the following composition and having pH 13.

| | |
|---|---|
| 1K Potassium silicate | 3.0 weight parts |
| Potassium hydroxide | 1.5 weight parts |
| Compound represented by the above formula 3 | 0.2 weight parts |
| Water | 95.3 weight parts |

As can be understood from the above examples, all of the samples containing the colorant in the photosensitive layer or the protective layer showed desensitization. Contrary to this, it was confirmed that in the photosensitive lithographic printing plate samples according to the present invention, the photosensitive wavelength region could be controlled without reducing sensitivity and the safelight aptitude could be improved.

In the photosensitive image-recording material of the present invention, it becomes possible to maintain oxygen cutoff property by providing an oxygen-cutoff layer containing a filter dye in addition to the protective layer. Therefore, a photosensitive image-recording material excellent in safelight aptitude can be obtained.

Further, since a filter dye can be contained in high concentration, a photosensitive image-recording material more excellent in safelight aptitude as compared with conventional materials can be obtained according to the present invention.

Example 1A and Comparative Examples 1A to 5A
Preparation of Support

An aluminum plate having a thickness of 0.3 mm was immersed in a 10 wt % aqueous sodium hydroxide solution at 60° C. for 25 seconds to effect etching, then washed with flowing water, washed with a 20 wt % aqueous nitric acid solution for neutralization and then washed with water. The plate was subjected to electrolytic surface roughening treatment in a 1 wt % aqueous nitric acid solution with applying alternating waveform electric current of sine wave at anode current of 300 coulomb/$dm^2$. Subsequently, the plate was immersed in a 1 wt % aqueous sodium hydroxide solution at 40° C. for 5 seconds, then immersed in a 30 wt % aqueous sulfuric acid solution and desmutting-treated at 60° C. for 40 seconds. Thereafter, the plate was subjected to anodization treatment for 2 minutes in a 20 wt % aqueous sulfuric acid solution at the electric density of 2 A/$dm^2$ so that the thickness of the anodic oxidation film reached 2.7 g/$m^2$. On measurement, the surface roughness was 0.3 μm (Ra indication by JIS B0601).

The sol-gel reaction solution shown below was coated on the back surface of the thus-treated plate by means of a bar coater, and the coated plate was dried at 100° C. for 1 minute, thereby a support having a back coat layer having a dry coating amount of 70 mg/m$^2$ was prepared.

| Sol-Gel Reaction Solution | |
| --- | --- |
| Tetraethyl silicate | 50 weight parts |
| Water | 20 weight parts |
| Methanol | 15 weight parts |
| Phosphoric acid | 0.05 weight parts |

When the above component was mixed and stirred, heat generation started after about 5 minutes. After the reaction was continued for 60 minutes, the following solution was added to the reaction solution, to thereby prepare a back coat layer coating solution.

| | |
| --- | --- |
| Pyrogallol-formaldehyde condensation resin (molecular weight: 2,000) | 4 weight parts |
| Dimethyl phthalate | 5 weight parts |
| Fluorine-containing surfactant (N-butylperfluorooctanesulfonamide ethyl acrylate/polyoxyethylene acrylate copolymer, molecular weight: 20,000) | 0.7 weight parts |
| Methanol Silica Sol (manufactured by Nissan Chemical Industries, Ltd., methanol: 30 wt %) | 50 weight parts |
| Methanol | 800 weight parts |

Preparation of Photosensitive Layer

The following photopolymerizable composition was coated on the thus-treated aluminum plate in a dry coating weight of 1.0 g/m$^2$, and the coated plate was dried at 80° C. for 2 minutes, thus a photosensitive layer was formed.

| | |
| --- | --- |
| Pentaerythritol tetraacrylate | 1.5 g |
| Allylmethacrylate/methacrylic acid copolymer (copolymerization molar ratio: 83/17) | 2.0 g |
| Photopolymerization initiator | |
| Sensitizing dye (D1A) | 0.09 g |
| Titanocene compound (T1A) | 0.1 g |
| Co-sensitizer (H1A) | 0.2 g |
| Fluorine-based nonionic surfactant (F-177P) | 0.02 g |
| Thermal polymerization inhibitor, (N-nitrosophenylhydroxyl) | 0.01 g |
| Pigment dispersion | 2.0 g |
| Composition of pigment dispersion | |
| Pigment Blue (15/6) | 15 weight parts |
| Allylmethacrylate/methacrylic acid copolymer (copolymerization molar ratio: 83/17) | 10 weight parts |
| Cyclohexanone | 15 weight parts |
| Methoxypropyl acetate | 20 weight parts |
| Propylene glycol monomethyl ether | 40 weight parts |
| Methyl ethyl ketone | 20.0 g |
| Propylene glycol monomethyl ether | 20.0 g |

Preparation of Protective Layer for Comparative Example 1A

A 3 wt % aqueous solution of polyvinyl alcohol (saponification degree: 98 mol %, polymerization degree: 550) was coated on the above-prepared photosensitive layer in a dry coating weight of 2 g/m$^2$, and dried at 100° C. for 2 minutes.

Preparation of Protective Layers for Comparative Examples 2A to 4A and Example 1A An aqueous solution containing 3 wt % of polyvinyl alcohol (saponification degree: 98 mol %, polymerization degree: 550) and each colorant shown in Table A below was coated on the above-prepared photosensitive layer in a dry coating weight of 2 g/m$^2$, and dried at 100° C. for 2 minutes.

Evaluation of Photosensitivity and Safelight Aptitude

Fuji Step Guide (manufactured by Fuji Photo Film Co., Ltd., a gray scale showing discontinuous variation of transmitted optical density at ΔD=0.15) was closely contacted on each of the above-obtained photosensitive materials, and exposure was performed using a xenon lamp through an optical filter (Kenko-BP-40) so as to reach the already known exposure energy. For the purpose of estimating the exposure aptitude to the short wavelength semiconductor laser, Kenko-BP-40 capable of exposure with a monochromatic light of 400 nm was used as the optical filter. Thereafter, the photosensitive material sample was subjected to development by immersing in the developing solution having the following composition at 25° C. for 30 seconds. Sensitivity (clear sensitivity) was computed from the highest stage where the image was completely removed (shown in Table A). "Clear sensitivity" is the lowest necessary energy for the formation of an image, and the lower the value, the higher is the sensitivity.

Further, a printing plate sample produced from each photosensitive lithographic printing plate sample allowed to stand under 100 lx of yellow fluorescent lamp was mounted on a printing machine and whether the non-image area was smeared with the printing ink or not was examined to investigate the allowable time capable of being left standing under a yellow lamp, i.e., the so-called safelight aptitude. The results of the investigation are shown in Table A below.

Developing Solution

An aqueous solution comprising the following composition and having pH 13.

| | |
| --- | --- |
| 1K Potassium silicate | 3.0 weight parts |
| Potassium hydroxide | 1.5 weight parts |
| Compound represented by the following formula (A) (Pellex NBL, manufactured by Kao Atlas Co., Ltd.) | 0.2 weight parts |
| Water | 95.3 weight parts |
| Compound represented by formula (A) | | wherein R represents H or $C_4H_9$.

TABLE A

| Example No. | Colorant (wt % in protective layer) | OD (405 nm) | OD (520 to 540 nm) | Clear Sensitivity (mJ/cm$^2$) | Yellow Lamp Safety (allowable time) |
| --- | --- | --- | --- | --- | --- |
| Example 1A | C-1 (1.5) | 0.04 | 2.8 | 0.09 | 120 min or more |
| Comparative Example 1A | None | — | — | 0.08 | 1 min |
| Comparative Example 2A | CR-1 (1.1) | 2.6 | 0.3 | 21.0 | 2 min |
| Comparative Example 3A | CR-2 (2.0) | 1.8 | 0.9 | 5.0 | 20 min |

TABLE A-continued

| Example No. | Colorant (wt % in protective layer) | OD (405 nm) | OD (520 to 540 nm) | Clear Sensitivity (mJ/cm²) | Yellow Lamp Safety (allowable time) |
|---|---|---|---|---|---|
| Comparative Example 4A | CR-3 (1.8) | 1.2 | 2.5 | 1.3 | 120 min or more |

The sample according to the present invention showed very excellent safelight aptitude as compared with the samples containing the colorants not having sufficient optical density in the secondary absorption wavelength region of the titanocene compound of from 520 to 540 nm. Further, it was confirmed that the safelight aptitude could be improved without varying the photosensitive composition at all and reducing sensitivity by adding the colorant showing low optical density at exposure wavelength.

As can be seen from the results in Table A, the lithographic printing plate according to the present invention is very high speed and shows sufficient sensitivity in scanning exposure system.

Examples 2A to 5A and Comparative Example 5A

Each lithographic printing plate was prepared according to the following procedure and printing performance was evaluated. The results obtained are shown in Table B below.

Pre-treatment of Support

A 1S aluminum plate having a thickness of 0.3 mm was subjected to brush-graining treatment using a No. 8 nylon brush and a suspension of 800 mesh pumice powder and water, and the surface of the plate was thoroughly washed with water. The etching was effected by immersing the plate in a 10 wt % sodium hydroxide aqueous solution at 70° C. for 60 seconds, the plate was further washed with flowing water, then washed with a 20 wt % nitric acid aqueous solution for neutralization, followed by washing with water. Under the condition of $V_A$ of 12.7 V, the plate was subjected to electrolytic surface roughening treatment in a 1 wt % aqueous nitric acid solution with applying alternating waveform electric current of sine wave at anode current of 300 coulomb/dm². The surface roughness determined was 0.45 μm (Ra indication by JIS B0601).

Hydrophilizing Treatment of Support Surface

The above support was immersed in a 2.5 wt % aqueous solution of No. 3 sodium silicate (SiO₂: 28 to 30%, Na₂O: 9 to 10%, Fe: 0.02% or less) having pH of 11.2 at 70° C. for 13 seconds, followed by washing with water. The amount of silicate on the surface obtained from the Si element on the surface measured by fluorescent X-ray analysis was 10 mg/m².

Coating of Intermediate Layer

The coating solution A of the intermediate layer having the composition shown below was prepared and coated on the hydrophilized surface of the above support by a wheeler at rotation rate of 180 rpm in a coating weight of phenylphosphonic acid of 20 mg/m², and the coated support was then dried at 80° C. for 30 seconds.

Intermediate Layer Coating Solution A

| Phenylphosphonic acid | 0.07 g to 1.4 g |
|---|---|
| Methanol | 200 g |

Coating of Photosensitive Layer

The photosensitive layer coating solution having the following composition was prepared and coated on the above support having the intermediate layer by a wheeler in a coating weight of from 1.0 to 2.0 g/m², and the coated photosensitive layer was dried at 100° C. for 1 minute.

| Photosensitive Layer Coating Solution | |
|---|---|
| 1. Glycerin dimethacrylate hexamethylenediisocyanate urethane prepolymer (manufactured by Kyoeisha Kagaku Co., Ltd., UA101H) | 1.5 g |
| 2. Polyurethane resin of condensation polymerization product of the following diisocyanate and diol 4,4'-Diphenylmethanediisocyanate (MDI) Hexamethylenediisocyanate (HMDI) Polypropylene glycol (PPG1000, weight average molecular weight: 1,000) 2,2-Bis(hydroxymethyl)propionic acid (DMPA) (copolymerization molar ratio (MDI/HMDI/PPG1000/DMPA): 40/10/15/35, actual acid value obtained by NaOH titration: 1.05 meq/g, weight average molecular weight obtained by GPC measurement: 45,000) | 2.0 g |
| 3. Sensitizing dye (shown in Table B) | 0.1 g |
| 4. Activator (T1A) | 0.1 g |
| 5. Co-sensitizer (shown in Table B) | 0.3 g |
| 6. Pigment dispersion | 2.0 g |
| Composition of pigment dispersion | |
| Pigment Blue (15/6) | 15 weight parts |
| Allylmethacrylate/methacrylic acid copolymer (copolymerization molar ratio: 83/17) (thermal polymerization) | 10 weight parts |
| Cyclohexanone | 15 weight parts |
| Methoxypropyl acetate | 20 weight parts |
| Propylene glycol monomethyl ether | 40 weight parts |
| Thermal polymerization inhibitor (N-nitrosophenylhydroxylamine aluminum salt) | 0.01 g |
| Surfactant (Megafac F-177, manufactured by Dainippon Chemicals & Ink Co., Ltd.) | 0.02 g |
| Methyl ethyl ketone | 20.0 g |
| Propylene glycol monomethyl ether | 20.0 g |

Coating of Protective Layer for Comparative Example 6A

A 3 wt % aqueous solution of polyvinyl alcohol (saponification degree: 98 mol %, polymerization degree: 550) was coated on the above-prepared photosensitive layer in a dry coating weight of 2 g/m², and the coated protective layer was dried at 100° C. for 2 minutes.

Coating of Protective Layers for Examples 2A to 5A

A 3 wt % aqueous solution of polyvinyl alcohol (saponification degree: 98 mol %, polymerization degree: 550) and an aqueous solution containing each colorant shown in Table B below were coated on the above-prepared photosensitive layer in a dry coating weight of 2 g/m², and dried at 100° C. for 2 minutes.

Evaluation of Photosensitivity and Safelight Aptitude

Each of the above-obtained samples was subjected to exposure and development in the same manner as in Example 1A and Comparative Examples 1A to 4A, and sensitivity (clear sensitivity) was computed. Further, the allowable time capable of being left standing under a yellow fluorescent lamp of 100 lx, i.e., the so-called safelight aptitude, was investigated in the same manner as in Comparative Examples 1A to 4A. The results obtained are shown in Table B below.

TABLE B

| Example No. | Colorant (wt % in protective layer) | Addition Polymerizable Composition | Binder Polymer | Sensitizing Dye | Co-sensitizer | Developing Solution | Clear Sensitivity (mJ/cm$^2$) | Yellow Lamp Safety (allowable time |
|---|---|---|---|---|---|---|---|---|
| Example 2A | C-2 (2.0) | M-1 | B-1 | D2A | H1A | DV-1 | 0.12 | 120 min or more |
| Example 3A | C-3 (3.0) | M-2 | B-1 | D3A | H1A | DV-2 | 0.09 | 120 min or more |
| Example 4A | C-4 (1.8) | M-2 | B-3 | D1A | H2A | DV-3 | 0.07 | 120 min or more |
| Example 5A | C-5 (2.4) | M-1 | B-2 | D3A | None | DV-1 | 0.14 | 120 min or more |
| Comparative Example 5A | None | M-2 | B-3 | D1A | H2A | DV-3 | 0.07 | 1 min |

Addition Polymerizable Compound in Table B
M-1:
Pentaerythritol tetraacrylate (manufactured by Shin Nakamura Kagaku Kogyo Co., Ltd., NK ester A-TMMT)
M-2:
Glycerin dimethacrylate hexamethylenediisocyanate urethane prepolymer (manufactured by Kyoeisha Kagaku Co., Ltd., UA101H)
Binder Polymer in Table B
B-1:
Allylmethacrylate/methacrylic acid/N-isopropylacrylamide copolymer (copolymerization molar ratio: 67/13/20),
Actual acid value obtained by NAOH titration: 1.15 meq/g, Weight average molecular weight obtained by GPC measurement: 130,000
B-2:
Allylmethacrylate/methacrylic acid copolymer (copolymerization molar ratio: 83/17)
Actual acid value obtained by NaOH titration: 1.55 meq/g, Weight average molecular weight obtained by GPC measurement: 125,000
B-3:
Polyurethane resin of the condensation polymerization product of the following diisocyanates and diol:
  4,4'-Diphenylmethanediisocyanate (MDI)
  A Hexamethylenediisocyanate (HMDI)
  Polypropylene glycol (PPG1000, weight average molecular weight: 1,000)
  2,2-Bis(hydroxymethyl)propionic acid (DMPA)
(copolymerization molar ratio (MDI/HMDI/PPG1000/DMPA): 40/10/15/35, actual acid value obtained by NaOH titration: 1.05 meq/g, weight average molecular weight obtained by GPC measurement: 45,000)

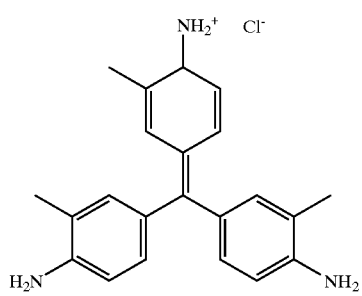
(C-1)

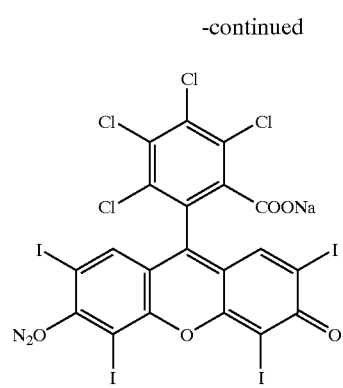
(C-2)

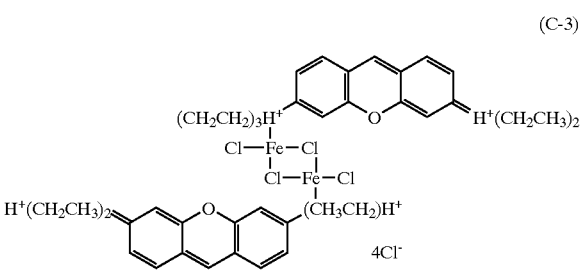
(C-3)

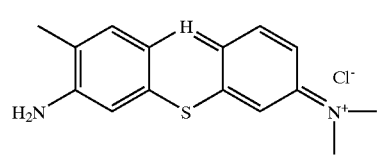
(C-4)

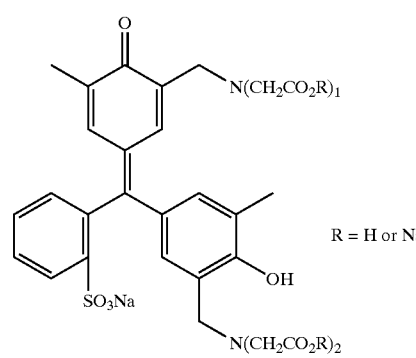
(C-5)

R = H or Na

-continued (CR-1) 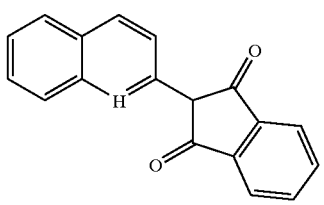

(CR-2) 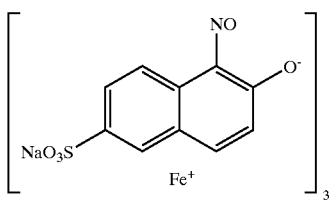

(CR-3) 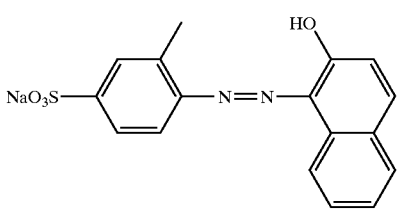

(D1A) 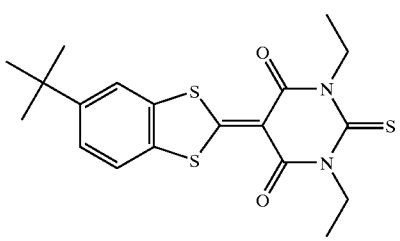

(D2A) 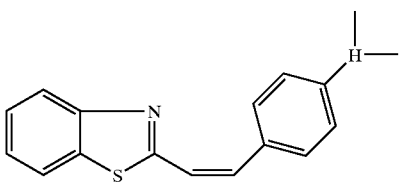

(D3A) 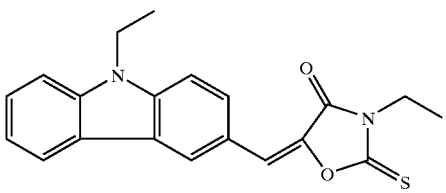

(H1A) 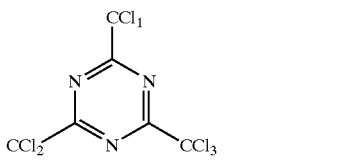

(H2A) 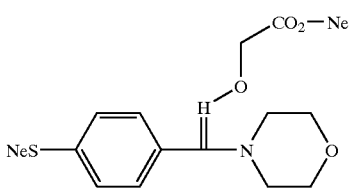

-continued (T1A) 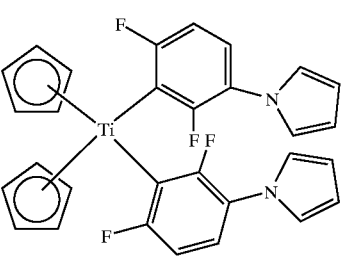

Developing Solution in Table B

DV-1
An aqueous solution comprising the following composition and having pH 10.

| | |
|---|---|
| Monoethanolamine | 0.1 weight parts |
| Triethanolamine | 1.5 weight parts |
| Compound represented by the following formula 1 (in the formula R represents H or $C_4H_9$) ((Pellex NBL, manufactured by Kao Atlas Co., Ltd.) | 4.0 weight parts |
| Compound represented by the following formula 2 (Nyucole, manufactured by Nihon Nyukazai Co., Ltd.) | 2.5 weight parts |
| Compound represented by the following formula 3 | 0.2 weight parts |
| Water | 91.7 weight parts |

Formula 1 naphthalene-R with $NaO_3S$ substituent

Formula 2 naphthalene-$O(C_2H_5O)nSO_3Na$

Formula 3

$NaO_2C-CH_2$ \ $N-CH_2CH_2-N$ / $CH_2-CO_2Na$
$NaO_2C-CH_2$ /            \ $CH_2-CO_2Na$

DV-2
An aqueous solution comprising the following composition and having pH 10.

| | |
|---|---|
| Sodium bicarbonate | 1.2 weight parts |
| Sodium carbonate | 0.8 weight parts |
| Compound represented by the above formula 1 | 3.0 weight parts |
| Compound represented by the above formula 2 | 2.0 weight parts |
| Compound represented by the above formula 3 | 0.2 weight parts |
| Water | 92.8 weight parts |

DV-3
An aqueous solution comprising the following composition and having pH 13.

| | |
|---|---|
| 1K Potassium silicate | 3.0 weight parts |
| Potassium hydroxide | 1.5 weight parts |

| Developing Solution in Table B | |
|---|---|
| Compound represented by the above formula 3 | 0.2 weight parts |
| Water | 95.3 weight parts |

As can be understood from the above examples, in the lithographic printing plate samples containing the colorants according to the present invention, the safelight fog can be remarkably improved with hardly reducing the sensitivity as compared with the sample not containing the colorant of the present invention.

According to the present invention, a photosensitive image-recording material excellent in safelight aptitude can be obtained without reducing sensitivity by adding a colorant showing OD of 1.0 or more in the wavelength region of from 520 to 540 nm and OD of 0.3 or less in the wavelength region of the exposure light source to a protective layer for the purpose of cutting off the secondary absorption of a titanocene photoinitiator contained in a photosensitive layer.

The entire disclosure of each and every foreign patent application from which the benefit of foreign priority has been claimed in the present application is incorporated herein by reference, as if fully set forth.

What is claimed is:

1. A photosensitive image-recording material sensitive to an exposure light source to form an image comprising a support having provided thereon a photosensitive layer comprising at least a titanocene photoinitiator, and an oxygen-cutoff layer in this order from the support, wherein a colored layer for cutting off lights other than the light of the wavelength of the exposure light source is provided between the photosensitive layer and the oxygen-cutoff layer, or on the oxygen-cutoff layer as an outermost layer.

2. The photosensitive image-recoding material according to claim 1, wherein said oxygen-cutoff layer comprises polyvinyl alcohol.

3. The photosensitive image-recoding material according to claim 1, wherein said support has a hydrophilic surface.

* * * * *